United States Patent [19]

Koyama

[11] Patent Number: 4,752,819
[45] Date of Patent: * Jun. 21, 1988

[54] SEMICONDUCTOR INTEGRATED CIRCUIT DEVICE HAVING A CARRIER TRAPPING TRENCH ARRANGEMENT

[75] Inventor: Yoshihisa Koyama, Mitaka, Japan

[73] Assignees: Hitachi Ltd., Tokyo; Hitachi Microcomputer Eng., Tokyo, both of Japan

[*] Notice: The portion of the term of this patent subsequent to Apr. 14, 2004 has been disclaimed.

[21] Appl. No.: 16,346

[22] Filed: Feb. 19, 1987

Related U.S. Application Data

[62] Division of Ser. No. 757,842, Jul. 22, 1985, abandoned.

[30] Foreign Application Priority Data

Jul. 25, 1984 [JP] Japan ............................... 59-153024
Sep. 26, 1984 [JP] Japan ............................... 59-199623

[51] Int. Cl.⁴ .................. H01L 27/02; H01L 29/78; H01L 29/06; G11C 11/24
[52] U.S. Cl. ................................. 357/41; 357/23.6; 357/55; 365/149
[58] Field of Search .............. 357/23.6, 41, 55, 59; 365/149

[56] References Cited

U.S. PATENT DOCUMENTS

| | | | |
|---|---|---|---|
| 4,163,245 | 7/1979 | Kinoshita | 357/23.6 |
| 4,353,086 | 10/1982 | Jaccodine et al. | 357/23.6 |
| 4,491,858 | 1/1985 | Kawamoto | 357/23.6 |
| 4,497,043 | 1/1985 | Iizuka et al. | 357/23.6 |
| 4,651,184 | 3/1987 | Malhi | 357/23.6 |
| 4,658,283 | 4/1987 | Koyama | 357/41 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,688,063 | 8/1987 | Lu et al. | 357/23.6 |
| 4,688,064 | 8/1987 | Ogura et al. | 357/23.6 |

Primary Examiner—Gene M. Munson
Attorney, Agent, or Firm—Antonelli, Terry & Wands

[57] ABSTRACT

Herein disclosed is a DRAM which has such a carrier trapping region around a memory cell array as can trap minority carriers deep in a semiconductor substrate so that the minority carriers to be generated in the semiconductor substrate by alpha rays may be sufficiently trapped. The memory cell of the DRAM has a capacitor which is partially formed of the semiconductor substrate. The carrier trapping region is formed by making use of trenches or a well region.

24 Claims, 18 Drawing Sheets

SEMICONDUCTOR INTEGRATED CIRCUIT DEVICE HAVING A CARRIER TRAPPING TRENCH ARRANGEMENT

This is a divisional of application Ser. No. 757,842, filed July 22, 1985 now abandoned.

BACKGROUND OF THE INVENTION

The present invention relates to a technique which is effective when applied to a semiconductor integrated circuit device (hereafter referred to as an "IC") and, more particularly, to a technique which is effective when applied to a dynamic type random access memory (hereafter referred to as a "DRAM").

The charge stored in the capacitor of the memory cell of the DRAM is subjected to the influences of the minority carriers which are generated in a semiconductor substrate (which will be referred to as a "substrate").

It has been proposed (as is disclosed in Japanese Patent Laid-Open No. 58—63939) that a carrier trapping region for trapping the minority carriers can be formed in the peripheral portion of a memory cell array.

The carrier trapping region is usually formed by the step of forming the source and drain regions of a MISFET. The carrier trapping region is formed to have a depth of about 0.3 to 0.4 microns from the main surface of the substrate by making the source and drain regions shallow.

I, the present inventor, have found out the following problems belonging to the carrier trapping region according to the aforementioned proposal.

The number of the minority carriers to be trapped is reduced by making the carrier trapping region shallow. As a result, the capacitor of the memory cell, which has its capacitance reduced by the high integration, becomes more liable to be influenced by the minority carriers.

On the other hand, another capacitor (which will be called a "trench type capacitor") is constructed (as is disclosed in Japanese Patent Published No. 58—12739) by using a trench or moat (which will be called a "trench"), which extends from the main surface into the inside of the substrate. The aforementioned carrier trapping region cannot trap the minority carriers which are generated in the deep portion of 3 to 5 microns where the trench is present.

SUMMARY OF THE INVENTION

An object of the present invention is to provide a technique which is capable of trapping a larger number of minority carriers in a semiconductor substrate.

Another object of the present invention is to provide a technique which is capable of trapping a sufficient number of minority carriers penetrating into the trench type capacitor.

The aforementioned and other objects and novel features of the present invention will become apparent from the following description taken with reference to the accompanying drawings.

Representative one of the inventions to be disclosed herein will be described in summary and brief, as follows.

The minority carriers generated in the substrate are sufficiently trapped by forming a carrier trapping region deeper than the source and drain regions of a MOSFET.

DESCRIPTION OF THE PREFERRED EMBODIMENTS

Figure 1:
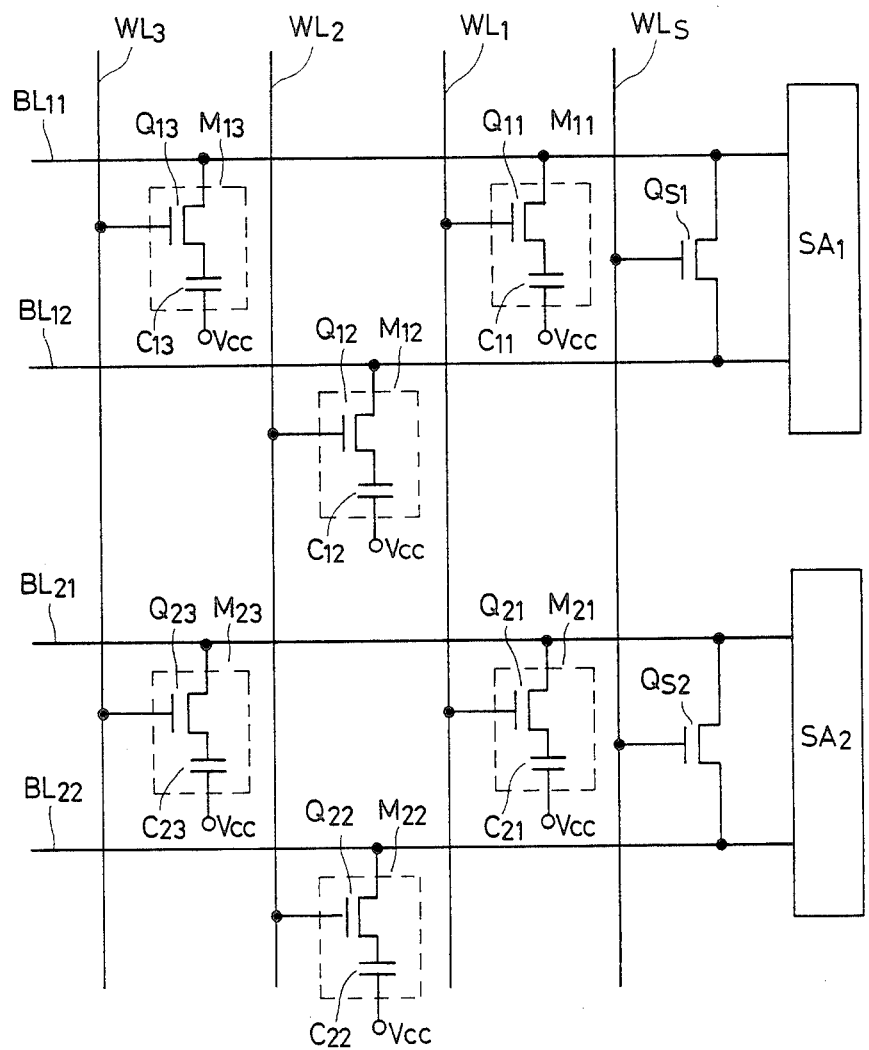
FIG. 1 is a circuit digram showing an equivalent circuit of the memory cell array of a DRAM.

The first embodiment of the present invention will be described with reference to FIGS. 1 to 5.

Throughout all the Figures, incidentally, parts or portions having identical functions are indicated at identical reference characters, and their repeated descriptions are omitted. Throughout all the top plan views, moreover, insulating films to be formed between the respective conductive layers are not shown so as to make the Figures easily understood. In the top plan views, the respective conductive layers are partially omitted so as to make the Figures easily understood.

FIG. 1 is a circuit diagram showing an equivalent circuit of the memory cell of a folded bit line type DRAM for explaining the first embodiment of the present invention.

In FIG. 1, reference letters $SA_1$ and $SA_2$ indicate sense amplifiers for amplifying and reading the electric signals which are transmitted through a pair of bit lines $BL_{11}$ and $BL_{12}$ or $BL_{21}$ and $BL_{22}$ extending in the "row direction" (which will mean the extending direction of the bit lines) from predetermined portions of the sense amplifiers.

Letters $Q_{S1}$ and $Q_{S2}$ indicate short-circuiting MISFETs each of which has its one terminal connected with the bit line $BL_{11}$ or $BL_{21}$ and its other terminal connected with the bit line $BL_{12}$ or $BL_{22}$. The MISFETs $Q_{S1}$ and $Q_{S2}$ short-circuit the bit lines $BL_{11}$ and $BL_{12}$ or the bit lines $BL_{21}$ and $BL_{22}$ by setting a gate electrode or a word line $WL_S$ at a power source potential $V_{CC}$. As a result, the bit lines $BL_{11}$ and $BL_{12}$ or $BL_{21}$ and $BL_{22}$ have their potential at about one half of the potential $V_{CC}$. The potential at one half of the potential $V_{CC}$ provides a reference level when the sense amplifiers $SA_1$ and $SA_2$ read out the electric signals.

Letters $M_{11}$, $M_{12}$, $M_{13}$, $M_{21}$, $M_{22}$ and $M_{23}$ indicate respective memory cells for storing data. The memory cell M comprises MISFETs (i.e., insulated gate type field effect transistors) $Q_{11}$, $Q_{12}$, $Q_{13}$, $Q_{21}$, $Q_{22}$ and $Q_{23}$, and capacitors $C_{11}$, $C_{12}$, $C_{13}$, $C_{21}$, $C_{22}$ and $C_{23}$. The MISFET Q has its one terminal connected with the bit line BL and its gate electrode connected with the word line WL. The capacitor C has its one terminal connected with one terminal of the MISFET Q and its other terminal connected with the terminal of the power source potential ($V_{CC}$).

Next, the layout of the memory cell array, the sense amplifier region, the carrier trapping region and so on of the DRAM of the present embodiment will be described in the following.

Figure 2:
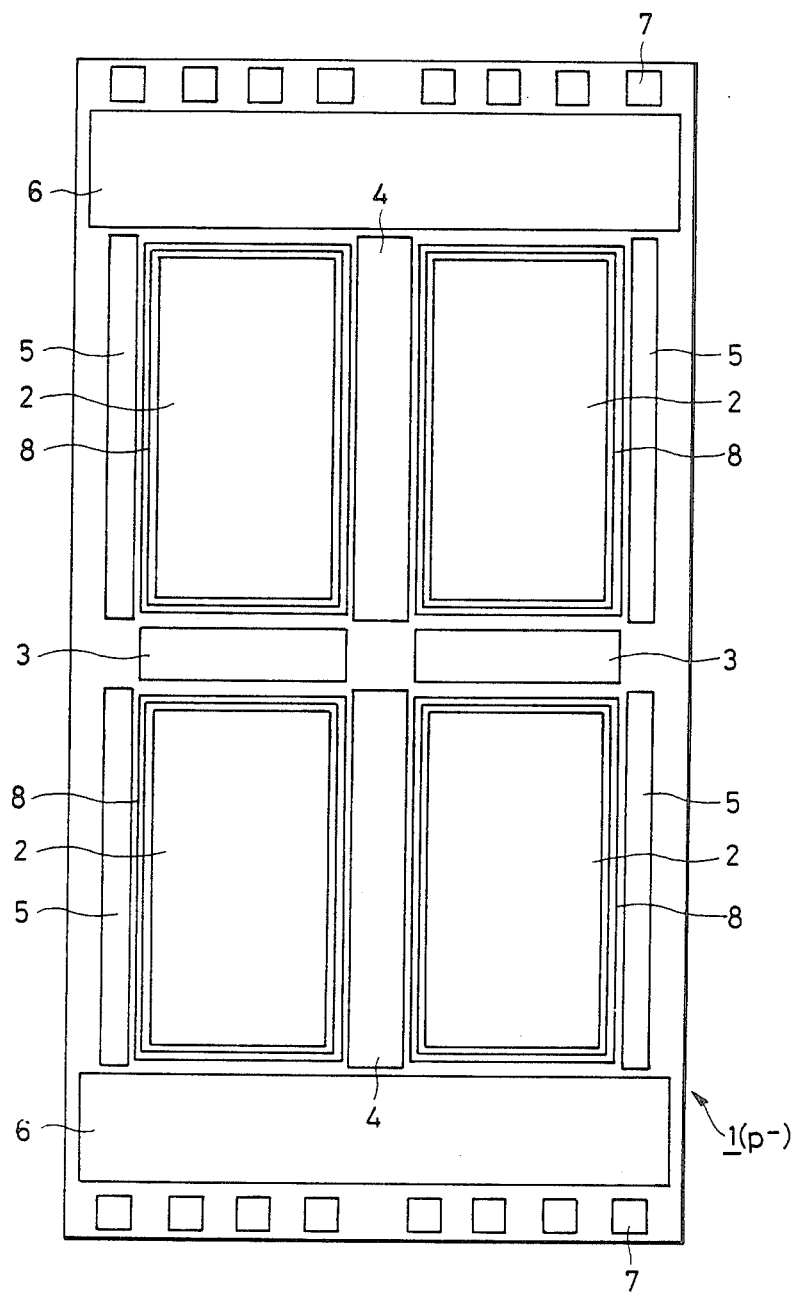
FIG. 2 is a top plan view for explaining the layout of the DRAM according to a first embodiment of the present invention.

FIG. 2 is a top plan view for explaining the layout of the DRAM of the present embodiment.

In FIG. 2, reference numeral 1 indicates a substrate of $p^-$-type silicon single crystal. Indicated at numeral 2 is a memory cell array which is formed in a divided portion of a predetermined main surface of the substrate such that it is arranged with the memory cells M.

A word line selecting circuit region 3 between the memory cell arrays 2 is arranged with both a word line selecting circuit (or an X-decoder) for selecting the word lines WL and a circuit for setting the word line $WL_2$ at the high potential $V_{CC}$.

A bit line selecting circuit region 4 between the memory cell arrays 2 is arranged with a bit line selecting circuit (or a Y-decoder) for selecting the bit lines BL.

A sense amplifier region 5 in the outer periphery of the memory cell array 2 is arranged with the sense amplifier SA.

A peripheral circuit region 6 in the outer periphery of the memory cell array 2 is equipped with an input buffer, an output buffer, a main amplifier and so on. Indicated at numeral 7 are bonding pads which are formed on the outer periphery of the substrate 1.

Indicated at numeral 8 is a carrier trapping region which is formed between the memory cell array 2 and the corresponding word line selecting circuit region 3, but line selecting circuit region 4, sense amplifier region 5 and peripheral circuit region 6. The carrier trapping region 8 is provided for trapping the minority carriers, which penetrate from the outer periphery into the inside of the memory cell array 2, the prevent the amount of the charge, which is stored in the capacitors C composing the memory cell M to provide the data, from being dropped.

Next, the specific structure of the present embodiment will be described with reference to FIGS. 3 to 5.

Figure 3:
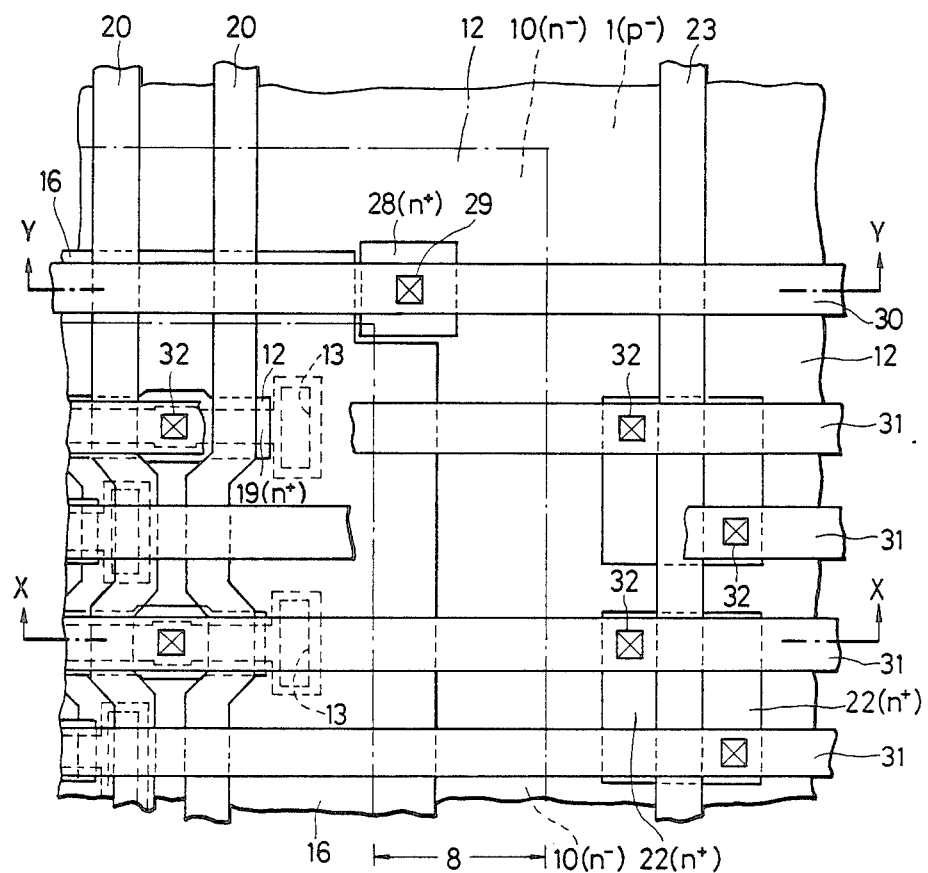
FIG. 3 is a top plan view showing the end portion of the memory cell array for explaining the first embodiment.
Figure 4A:
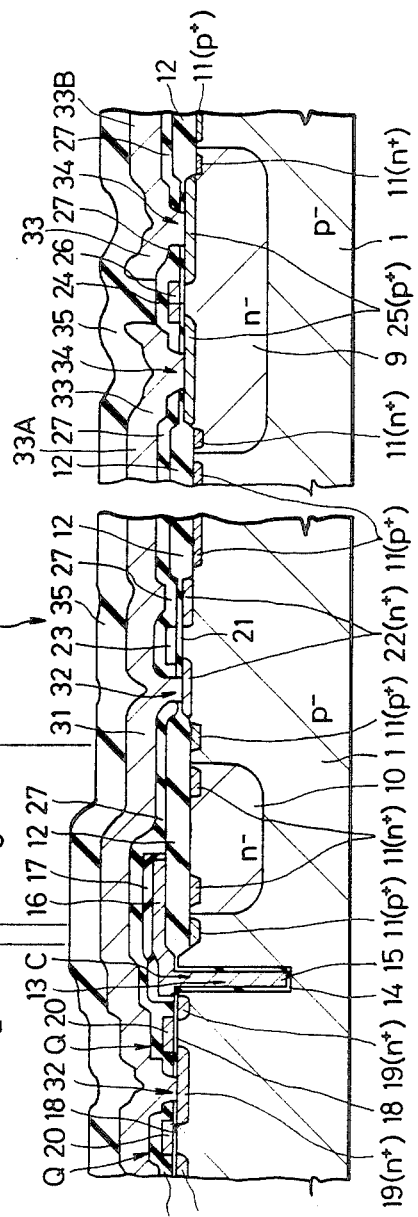
FIG. 4A is a section taken along line X—X of FIG. 3.
Figure 4B:
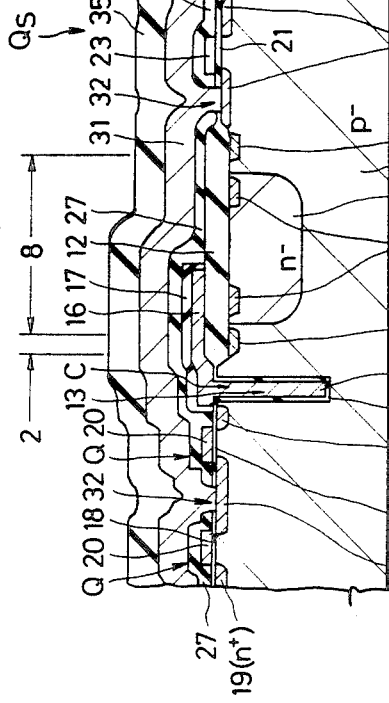
FIG. 4B is a sectional view showing a portion of the peripheral circuit of FIG. 2.
Figure 5:
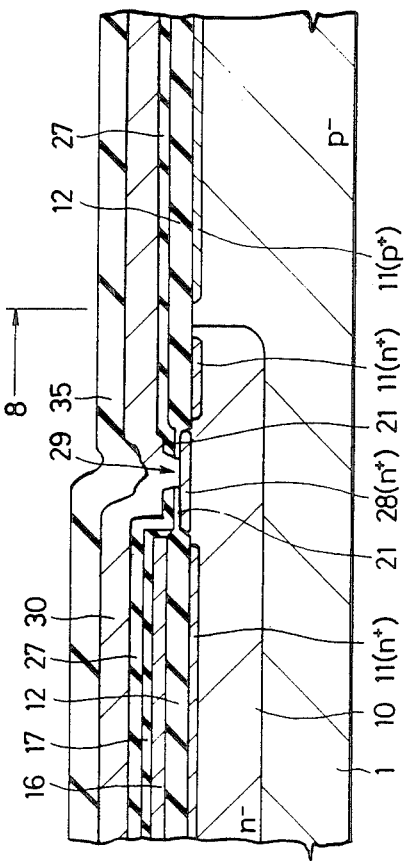
FIG. 5 is a section taken along line Y—Y of FIG. 3.

FIG. 3 is a specific top plan view showing the DRAM of FIG. 2, and FIGS. 4A and 5 are sections taken along lines X—X and Y—Y of FIG. 3, respectively. FIG. 4B is a sectional view showing the structure of a P-channel MOSFET constructing the peripheral circuit of the DRAM of FIG. 2.

In FIGS. 3 to 5, one memory cell comprises the memory cell selecting switch MISFET Q and the capacitor C.

This capacitor C comprises an insulating film 14 acting as a dielectric element, conductive layers 15 and 16 acting as electrodes, and the substrate 1. Since the conductive layers 15 and 16 are supplied with a fixed potential, e.g., the power source potential $V_{CC}$, there is formed in the surface of the substrate 1 a depletion or inversion layer, which provides the other electrode of the capacitor C. A trench or moat 13 is formed by selecting etching the substrate 1 by the anisotropic etching (or the reactive ion etching). The depth from the main surface of the substrate 1 to the bottom of the trench 13 is about 3 to 5 microns. The insulating film 14 is a silicon oxide film, for example, which is made to have thickness of 300 angstroms (hereafter referred to as [A]) by thermally oxidizing the main surface of the substrate 1 and the inner wall of the trench 13. The conductive layers 15 and 16 are made of polycrystalline silicon. The conductive layer 15 is used to bury the trench 13. The conductive layer 16 is formed to have a thickness of 6,000 to 8,000 [A]. The conductive layer 16 is formed in the whole area of the memory cell array 2 except the region which is to be formed with the MISFET Q. Incidentally, an insulating film 17 is a silicon oxide film which is formed to have a thickness of 3,000 to 4,000 [A] by thermally oxidizing the conductive layer 16. The conductive layer 16 is given a final thickness of 4,000 to 5,000 [A] by forming the insulating film 17.

The MISFET Q comprises a gate insulating film (or a $SiO_2$ film) 18, $n^+$-type semiconductor regions 19 for providing source or drain regions, and a gate electrode 20. This conductive layer 20 extends in the memory cell array 2, as shown in FIG. 3, so that it is used as the word line WL. This word line WL is electrically isolated from the conductive layer 16 by the insulating film 17.

A data line DL extends in the memory cell array 2 in a direction perpendicular to the word line WL. The data line DL is made of a conductive layer 31 made of aluminum. This conductive layer 31 is electrically insulated from the conductive layer 20 by an insulating film 27 made of phosphosilicate glass.

The peripheral circuit that is, the decoder, the sense amplifier, buffer, main amplifier and so on are complementary MIS circuits which are composed of n-channel MISFETs and p-channel MISFETs. The n-channel MISFETs are made to have the same structure as that of the MISFETs Q of the memory cell.

The p-channel MISFET is made to have the structure shown in FIG. 4B. This p-channel MISFET comprises a gate insulating film (or a $SiO_2$ film) 24, $p^+$-type semiconductor regions 25 for providing source or drain regions, and a gate electrode 26. With the semiconductor regions 25, there is connected a conductive layer 33 which is made of aluminum. The insulating film 24, the conductive layer 26 and the conductive layer 33 are formed by the same fabricating steps as those for forming the insulating film 18, the conductive layer 20 and the conductive layer 31, respectively.

The p-channel MISFET is formed in an $n^-$-type well region 9 which in turn is formed in a predetermined position in the $p^-$-type semiconductor substrate 1. Ions of an n-type impurity (e.g., phosphor) are implanted into the substrate 1 at a voltage of 125 [KeV] and in a concentration of $4 \times 10^{12}$ [atoms/cm$^2$] so as to form the well region 9. The phosphor thus introduced selectively into the substrate 1 is diffused by a heat treatment at 1,100 to 1,200 [°C.]. As a result, the well region 9 has a depth of 3 to 4 microns from the main surface of the substrate 1.

The carrier trapping region 8 is formed along the end of the memory cell array 2, as shown in FIG. 3. The carrier trapping region 8 comprises an $n^-$-type semiconductor region 10 and an $n^+$-type semiconductor region 29. The semiconductor region 10 is formed along the end of the memory cell array 2, whereas the semiconductor region 28 is formed in the main surface portion of the semiconductor region at the corner of the memory cell array 2.

The special step of forming the semiconductor region 10 is not necessary. In other words, this region 10 is formed by the common step of forming the well region 9. As a result, the semiconductor region 10 has a depth 3 to 4 microns like the well region 9. The semiconductor region 10 has a width of 6 to 7 microns.

The n+-type semiconductor region 28 is provided for applying to such a potential, e.g., the power source potential $V_{CC}$ of 5.0 [V] to the semiconductor region 10 as biases the region 10 inversely to the substrate 1. Moreover, the semiconductor region 28 is provided for collecting the minority carriers which are trapped by the carrier trapping region 8. The semiconductor region 28 is formed at the same step as that of forming the semiconductor regions 19 so that its especial step may be dispensed with. As shown in FIGS. 3 and 5, more specifically, an n-type impurity is introduced by using the field insulating field 12 and/or the conductive layer 16 as a mask into the region which is not formed with a field insulating film 12. The semiconductor region 28 is electrically connected with a conductive layer 30 through a connecting hole 29 which is formed by selectively removing insulating films 21 and 27. The conductive layer 30 is formed simultaneously with the conductive layer 31 to extend in the common direction. The conductive layer 30 applies the power source potential $V_{CC}$ to the semiconductor region 28. The conductive layer 30 can use the line for applying the power source potential $V_{CC}$ to the conductive layer 16.

The power source potential $V_{CC}$ (e.g., 5.0 [V]) is applied to the carrier trapping region 8. Either a circuit earth potential $V_{SS}$ (0 [V]) or a substrate bias voltage $V_{BB}$ (−2.0 to −3.0 [V]) is applied to the substrate 1. As a result, a depletion layer is formed in the PN junction between the substrate 1 and the semiconductor region 10. This depletion layer penetrates into the substrate 1 by 1 to 2 microns because the PN junction is one of low impurity concentration.

In the present embodiment, the carrier trapping region 8 can be deemed to be substantially constructed of the aforementioned depletion layer and the semiconductor region 10. The depletion layer can trap the minority carriers which are generated in a portion as deep as 4 to 5 microns from the main surface of the substrate 1. For this reason it is not always necessary to form the semiconductor region 10 deeper than the trench 13 of 3 to 5 microns.

The minority carriers to penetrate into the depletion or inversion layer constructing the capacitor C can be reduced by the carrier trapping region 8. Especially the minority carriers to invade into the capacitor C constructing the memory cell in the peripheral portion of the memory cell array 2 can be reduced. This makes it possible to elongate the time period for which the capacitor C can hold the charge, i.e., the data holding time period.

In the present embodiment, the bit line shortcircuiting MISFET $Q_S$ is formed adjacent to and outside of the carrier trapping region 8. The MISFET $Q_S$ comprises the gate insulating film 21, source and drain regions foremd of n+-type semiconductor regions 22, and a conductive layer 23 used as a gate electrode. The insulating film 21, the semiconductor regions 22 and the conductive layer 23 are formed by the same steps as those of forming the insulating film 18, the semiconductor regions 19 and the conductive layer 20, respectively.

In the conducting state of the MISFET $Q_S$, i.e., in the state in which the carriers are moving from the source region to the drain region, the carriers are abruptly accelerated to have a high energy (i.e., to become the so-called "hot electrons") by the electric field established in the vicinity of the drain. The minority carriers are generated in the channel region of the MISFET by the carriers having that high energy. The invasion of the minority carriers can be sufficiently reduced because the carrier trapping region 8 is formed in the outer periphery of the memory cell array 2.

The gap between the semiconductor region 10 and the capacitor C in the peripheral portion of the memory cell array 2 is made substantially equal to that between the two adjacent capacitors C at the central portion of the memory cell array 2. The above-specified gap is desirably set to prevent the minority carriers trapped by the carrier trapping region 8 from penetrating into the capacitor C and the carrier trapping region 8 from absorbing the charge stored in the capacitor C. Moreover, the gap between the semiconductor region 10 and the MISFET formed outside of the former, i.e., the n-channel MISFET, is made substantially equal to that between the adjacent two capacitors C at the central portion of the memory cell array 2. This gap is also provided for preventing any unnecessary leakage current from flowing between the semiconductor region 10 and the aforementioned MISFET.

A channel stopper region 11 is formed of an n+-type semiconductor region or a p+-type semiconductor region which is formed below the field insulating film 12. It is not absolutely necessary to form the n+-type channel stopper.

Indicated at numeral 35 is an insulating film which is so formed over the insulating film 27 as to cover the conductive layers 30, 31 and 33 so that it acts as a protecting film for the conductive layers 30, 31 and 33.

In the first embodiment, the impurity concentration of the semiconductor region 10 may be higher than that of the well region 9.

The semiconductor region 10 is formed by introducing an n-type impurity in a dosage of about $4 \times 10^{13}$ [atoms/cm$^2$], for example. The n-type impurity for foring the well region 9 and the semiconductor region 10 is introduced by different ion implantation steps. And, the n-type impurity thus introduced is diffused into the substrate by a common heat treatment step. This makes it possible to drop the resistance of the semiconductor region 10. Since the depletion layer extending from the semiconductor region 10 is formed deep in the substrate 1, the minority carriers generated deep in the substrate 1 can be trapped.

Figure 6:
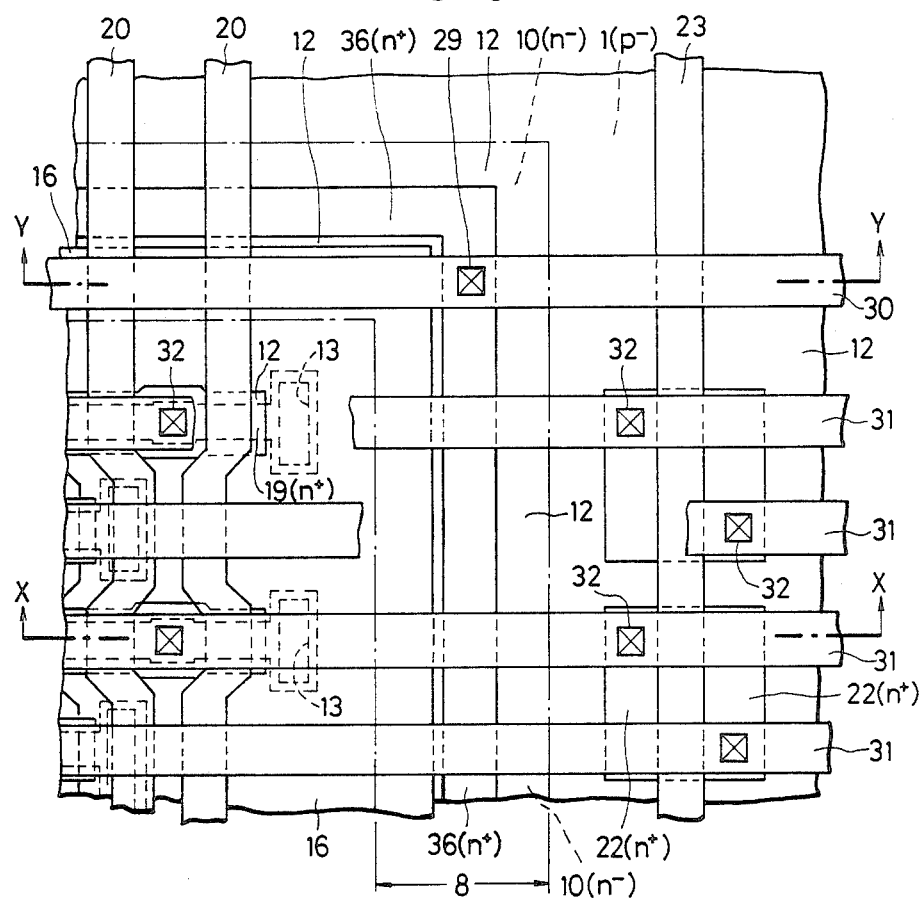
FIG. 6 is a top plan view showing the end portion of the memory cell array for explaining a modification of the first embodiment.
Figure 7:
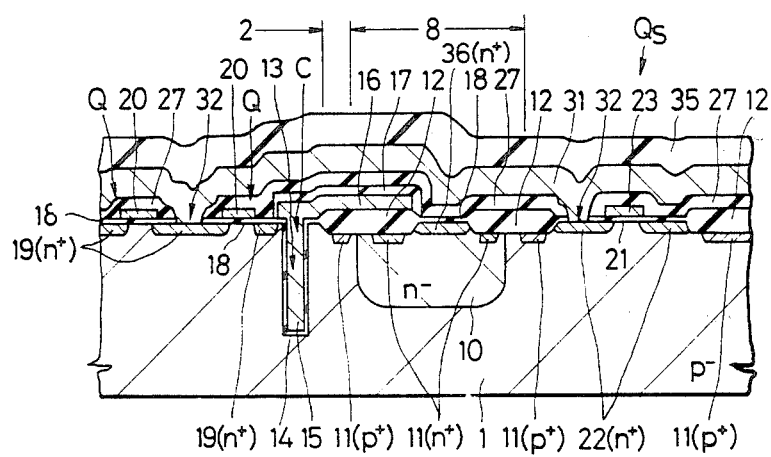
FIG. 7 is a sectional view showing the structure of the memory cell array of FIG. 6.

The first embodiment can have its carrier trapping region modified, as shown in FIGS. 6 and 7.

FIG. 6 is a top plan view showing an essential portion of the end portion of the memory cell array, and FIG. 7 is a section taken along line X—X of FIG. 6. FIGS. 6 and 7 correspond to FIG. 3, 4A and 4B, respectively. The section taken along line Y—Y of FIG. 6 is almost like FIG. 5. The carrier trapping region of FIGS. 6 and 7 is formed, as shown in FIG. 2.

In FIGS. 6 and 7, an n+-type semiconductor region 36 is formed to extend in a predetermined main surface of the semiconductor region 10. The region 36 has its predetermined portion connected electrically with the conductive layer 30 through the connecting hole 29 like the first embodiment. The semiconductor region 36 is formed to apply the power source potential $V_{CC}$ in a satisfactory extent to the semiconductor region 10.

The semiconductor region 10 has its potential dropping to the lower level than the power source potential ($V_{CC}$) as its becomes more distant from the connection between the conductive layer 30 and the semiconductor region 10. This potential drop is caused by the potential drop inside of the semiconductor region 10. The present embodiment is characterized in that the semiconductor region 36 having a very high impurity concentration for effecting reduction in the resistance is formed in the semiconductor region 10 so as to reduce that potential drop. Since the semiconductor region 36 has such a low resistance as can be neglected, as compared with the resistance of the semiconductor region 10, the aforementioned potential to be applied by the conductive layer 30 can be substantially uniformly applied to the semiconductor region 10. As a result, the minority carriers can be trapped to a satisfactory extent even in the carrier trapping region 8 distance from the connecting portion between the semiconductor region 10 and the conductive layer 30. On the other hand, the semiconductor region 36 is used as a transmission path for carrying out the minority carriers, which are trapped by the carrier trapping region 8, to the outside of the substrate 1.

In order to form the semiconductor region 36, the main surface of the substrate 1, which is to be formed with the semiconductor region 36, is not oxidized at the thermally oxidizing step for forming the field insulating film 12. And, the semiconductor region 36 is formed by the same step as that for forming the semiconductor region 19 and 22 by using the field insulating film 12 as the mask.

In the first embodiment, an additional conductive layer may be so formed over the semiconductor region 10 or 36 as to enclose the memory array 2.

This additional conductive layer may be formed before or after the conductive layers 30, 31 and 33 are formed. The additional conductive layer is made of the same material as that of the aluminum layer or the word line WL. The semiconductor region 10 or 36 is electrically connected with that additional conductive layer through connecting holes. These connecting holes are formed in plurality between the conductive layers 20 in the portion, where the additional conductive layer extends in the row direction, and in plurality at a predetermined interval in the portion wherein the additional conductive layer extends in the column direction. The additional conductive layer is insulated by the insulating film from the conductive layers 30, 31 and 33.

The conductive layer 30 is connected with the additional conductive layer through the connecting holes which are formed by selectively removing the insulating film. The power source potential ($V_{CC}$) can be applied in a satisfactory extent to the semiconductor region 10 by forming the additional conductive layer.

In the first embodiment, each of the semiconductor regions may have its conductivity type reversed.

In this case, the MISFETs of the memory cells are to have the p-channel type. The substrate and the well region are made to have the n$^-$-type and the p$^-$-type, respectively. The carrier trapping region is made to have the p$^-$-type by the same step as that of forming the p$^-$-type well region. The well region is formed by introducing a p-type impurity such as boron into the substrate and by subsequently diffusing the p-type impurity by a heat treatment. The aforementioned p-type impurity is introduced into the substrate by the ion implantation at a voltage of 125 [KeV] and in a dosage of $4 \times 10^{12}$ [atoms/cm$^2$]. The p-type carrier trapping region is made deep by 3 to 4 microns from the main surface of the substrate like the well region. The carrier trapping region has a p$^+$-type semiconductor region in the main surface of the corner portion of the memory cell array like the semiconductor region 28 of the first embodiment. This p$^+$-type semiconductor region is connected through the connecting holes with the conductive layer. This conductive layer is connected with the reference potential of the IC, i.e., the earth potential (e.g., 0 [V]) of the circuit. The substrate is supplied with the power source potential (e.g., 5.0 [V]).

The capacitor C composing the memory cell M is constructed by using a trench like the first embodiment, for example. The conductive layer formed in the trench is connected with the conductive layer at the earth potential (e.g., 0 [V]) of the circuit.

The aforementioned carrier trapping region reduces the number of the minority carriers which will penetrate into the memory cell array because it traps the unnecessary carriers (or positive holes) in the substrate.

In the first embodiment, the conductive layer 30 is not limited to being formed only at the end portion of the memory cell array 2. A plurality of these layers can also be formed at the central portion. In this modification, the memory cell is not formed below the conductive layers 30, and the n$^+$-type semiconductor regions 28 are formed in a manner to correspond to the conductive layers 30.

Figure 8:
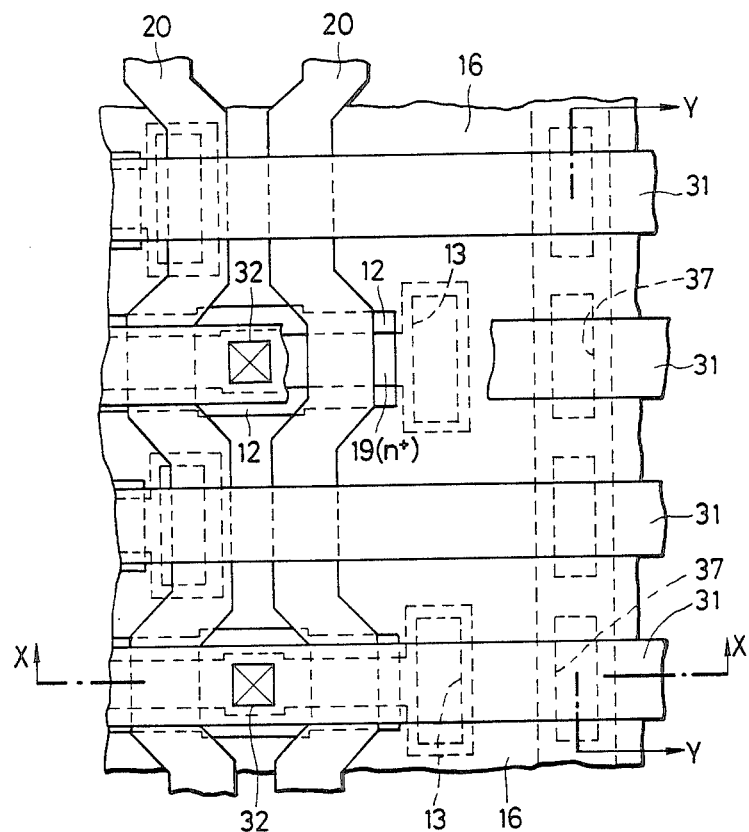
FIG. 8 is a top plan view showing the end portion of the memory cell array for explaining a second embodiment of the present invention.
Figure 9:
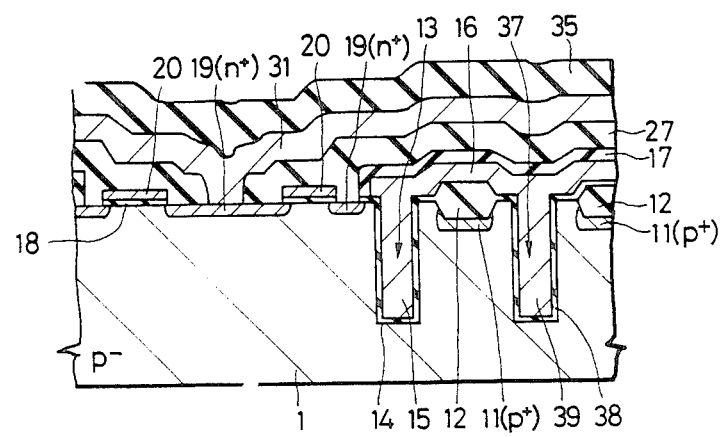
FIGS. 9 and 10 are sections taken along lines X—X and Y—Y of FIG. 8, respectively.
Figure 10:
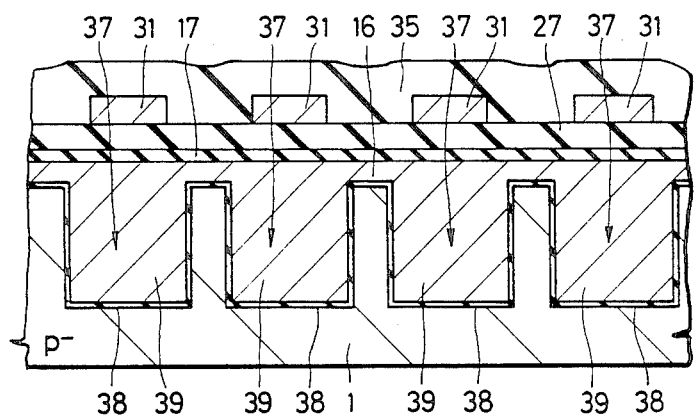

FIGS. 8 to 10 are views showing the second embodiment of the present invention. In this second embodiment, the carrier trapping region is formed by the trenches which are formed simultaneously with the trenches forming the capacitors of a memory cell. The carrier trapping region is so arranged as is shown in FIG. 2.

FIG. 8 is a top plan view showing the end portion of the memory cell array of a DRAM. FIGS. 9 and 10 are sections taken along lines X—X and Y—Y of FIG. 8, respectively. Indicated at reference numeral 37 are trenches which are arranged at a predetermined interval in a column form in the carrier trapping region 8. Each trench 37 is formed therein with an insulating film 38, which covers all over the inner wall of the trench 37, and a conductive layer 39 for burying the trench 37. Since the power source potential $V_{CC}$ is applied to the conductive layer 39, the carrier trapping region 8 is formed around the trench 37 by a depletion layer. The depth of the trench 37, i.e., the depth from the main surface of the substrate 1 to the bottom of the trench 37 is similar to that of the trench 13 for forming the aforementioned capacitor C. The depletion layer formed around the trench 37 is formed as deep from the main surface of the substrate 1 into the inside as that formed around the trench 13. The minority carriers to penetrate from the substrate 1 in the outer periphery of the memory cell array 2 into the memory cell array 2 can be sufficiently trapped by the carrier trapping region 8. Especially, the charge amount of the memory cell at the end portion of the memory cell array 2 can be sufficiently prevented from being changed by the minority carriers.

The conductive layer 16 is made to extend to over the carrier trapping region 8 which is present outside of the memory cell array 2. The conductive layer 16 is connected with the conductive layer 39. This conductive layer 39 is made of the polycrystalline silicon which is formed by the same step as that of the conductive layer 15.

The gap between the trenches 37 is so determined that the depletion layers to be formed around the respective trenches 37 may be coupled to each other. As a result, none of the unnecessary minority carriers will penetrate into the memory cell array 2 through the trenches 37.

Moreover, the gap between the closest trenches 13 and 37 is made substantially equal to that between the adjacent two trenches 13 located at the center of the memory cell array 2. As a result, the depletion layers to be formed around the closest trenches 13 and 37, respectively, will not couple. This prevents the charge stored in the capacitor C for providing data from leaking to the carrier trapping region 8. The charge of the capacitor C is also prevented from being dropped by the leak of the minority carriers, which are trapped by the carrier trapping region 8, into the capacitor C.

In the carrier trapping region 8, there is formed in the main surface of the substrate 1 the inversion layer which is formed of the minority carriers. The inversion layer thus formed is used as a transmission path when the minority carriers trapped by the carrier trapping region 8 are released to the outside of the substrate 1.

Figure 11:
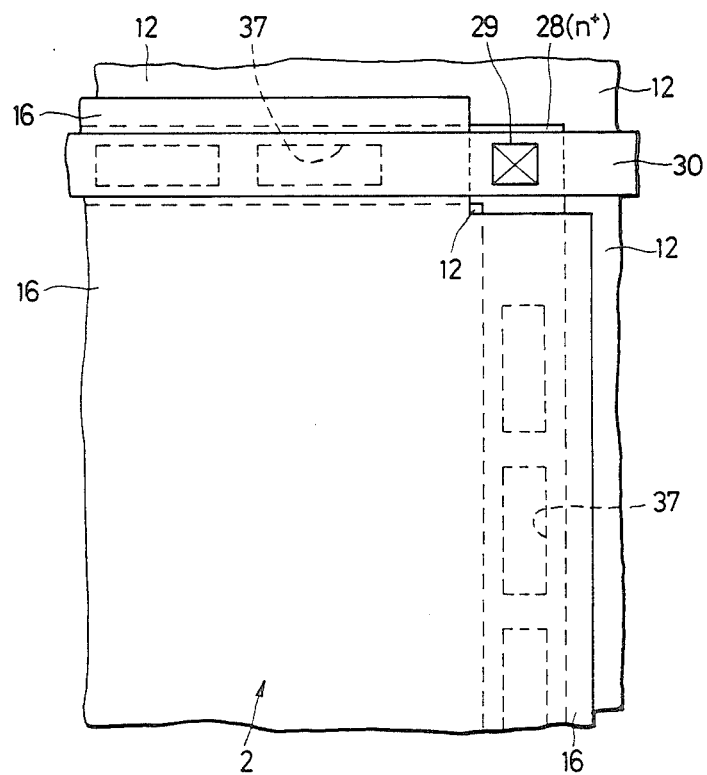
FIG. 11 is a top plan view showing the corner portion of the memory cell array of the DRAM of the second embodiment.

As shown in FIG. 11, there is formed in the periphery of the memory cell array 2 the carrier trapping region 8 which is formed with the trenches 37. In order to collect the minority carriers trapped by the carrier trapping region 8, moreover, the $n^+$-type semiconductor region 28 is formed in the corner of the memory cell array 2. Like the first embodiment, the semiconductor region 28 is connected with the conductive layer 30. The minority carriers trapped by the carrier trapping region 8 penetrate to reach the semiconductor region 28 through the aforementioned inversion or depletion layer, until they are released through the conductive layer 30 to the outside of the substrate 1. In FIG. 11, the memory cell array 2 is omitted.

In order to improve the trapping ratio of the minority carriers by the carrier trapping region 8, grooves extending continuously in the row or column direction without forming the gaps between the trenches 37. In this modification, an insulating film covering the inner walls of the grooves is formed likewise, and a conductive layer to be buried in the grooves is formed like the conductive layer 39.

Next, a specific process for fabricating the second embodiment will be described in the following. Incidentally, the fabrication process of the first embodiment is similar to that of the second embodiment.

FIGS. 12 to 16 are views for explaining the respective fabrication steps of the present embodiment.

Figure 12:
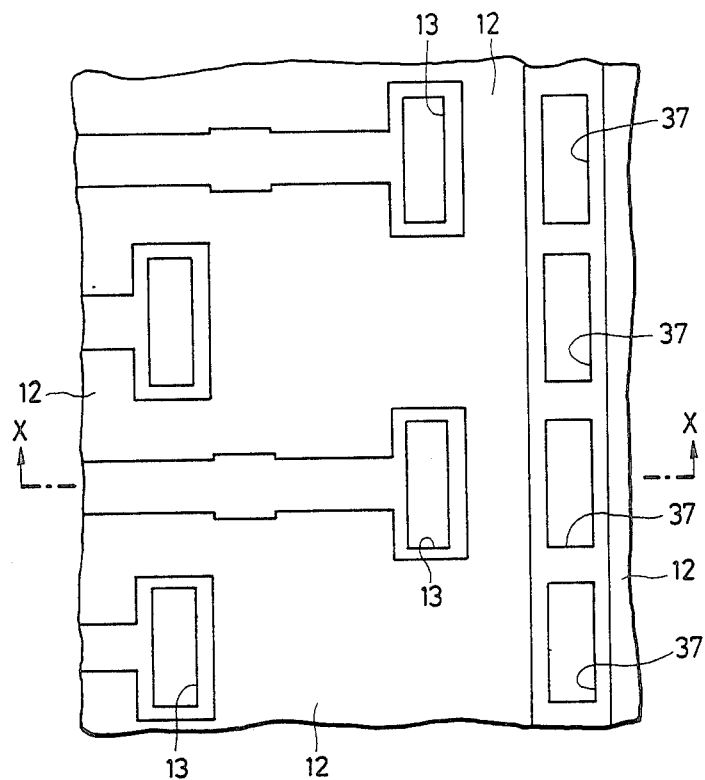
FIGS. 12 to 16 are views for explaining the respective steps of fabricating the second embodiment.
Figure 13:
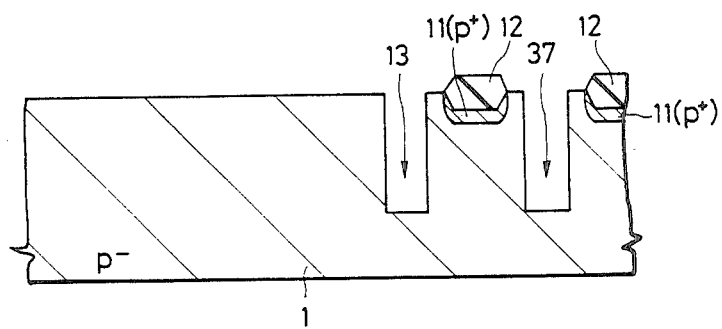
Figure 14:
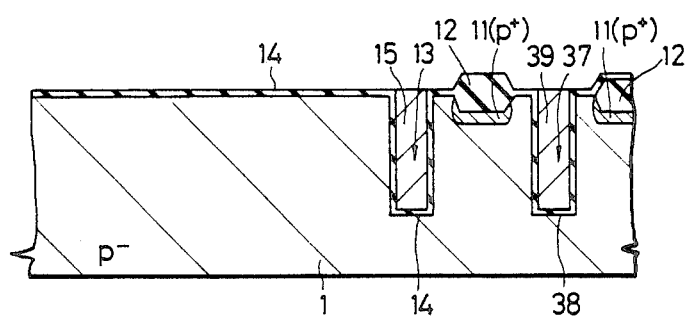
Figure 15:
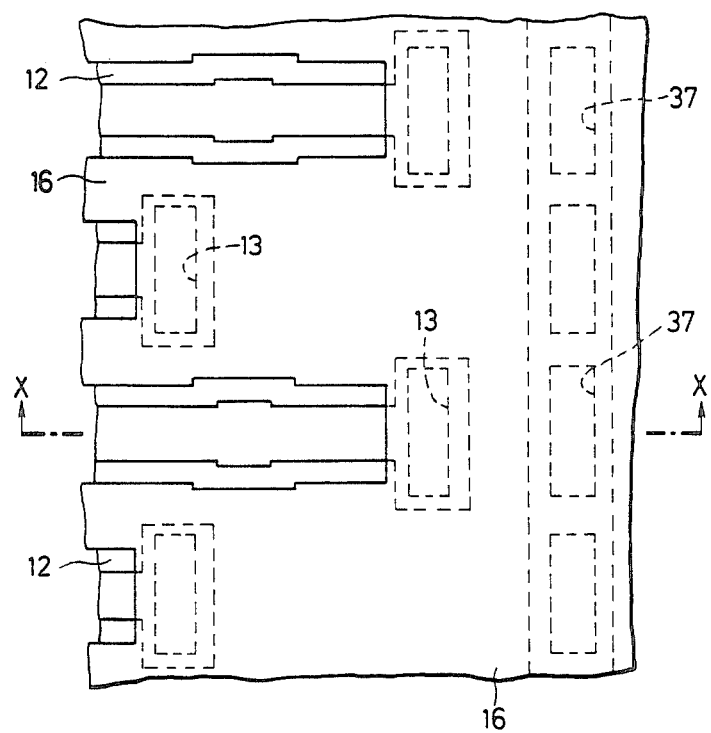

In these Figures: FIGS. 12 and 15 are top plan views showing the essential portions of the memory cell array and the carrier trapping region; FIG. 13 is a section taken along line X—X of FIG. 12; FIG. 14 is a sectional view showing the end portion of the memory cell array; and FIG. 16 is a section taken along line X—X of FIG. 15.

The substrate 1 is covered with the field insulating film 12 and the channel stopper region 11. Then, an etching mask for forming the trenches 13 and 37 is formed. This etching mask is made of, for example: a silicon oxide film formed on the main surface of the substrate 1 by its thermal oxidation; a silicon nitride film formed over the silicon oxide film by chemical vapor deposition (which will be shortly called the "CVD" technique); and a phosphosilicate glass film formed over the silicon nitride film by the CVD technique. Then, the etching mask of the regions to be formed with the trenches 13 and 37 is selectively removed to form the etching mask. By using the etching mask thus prepared, as shown in FIGS. 12 and 13, the trenches 13 and 37 are formed by the anisotropic etching (or the reactive ion etching). The trenches 13 and 37 are formed to have a depth 3 to 5 microns. In this embodiment, the step of exclusively forming the trenches 37 can be dispensed with.

After the step shown in FIGS. 12 and 13, the etching mask is removed, and the insulating film made of a silicon oxide film of 300 [A] is formed by thermally oxidizing the inner walls of the trenches 13 or 37 and the main surface of the substrate 1. Incidentally, the insulating film 14 may be composed of a silicon oxide film (of 100 [A]), an overlying silicon nitride film (120 [A]), and an overlying silicon oxide film (30 [A]). After the insulating film 14 is formed, the conductive layers 15 and 39 are formed. A polycrystalline silicon layer is first buried in the trenches 13 and 37 by the CVD and is then formed to have a thickness sufficient for covering the substrate 1. Then, the polycrystalline silicon layer thus formed is gradually etched from its surface to such an extent that the conductive layers 15 and 39 have their surfaces flattened. Thus, the conductive layers 15 and 39 can be formed because the polycrystalline silicon layer is left in the trenches 13 and 37.

Figure 16:
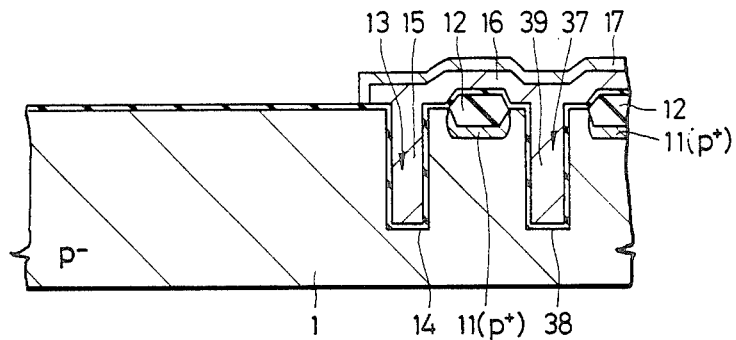

After the step shown in FIG. 14, the conductive layer 16 and the insulating film 17 are formed, as shown in FIGS. 15 and 16. The conductive layer 16 is made of a polycrystalline silicon layer formed by the CVD. This polycrystalline silicon layer is formed all over the surface of the substrate 1 to have a thickness of 7,000 to 8,000 [A], and has phosphor introduced thereinto in a concentration of $10^{20}$ [atoms/cm$^3$] to reduce its resistance. Moreover, the polycrystalline silicon layer is removed selectively from both the region to be formed with the MISFET Q and the region to be formed with the semiconductor region 28 shown in FIG. 11. In other words, the conductive layer 16 is left over the memory cell array 2 and the carrier trapping region 8. The insulating film 17 is made of silicon oxide film formed by thermally oxidizing the conductive layer 16. By forming the insulating film 17, the conductive layer 16 has a thickness of about 4,000 to 5000 [A].

When the insulating film 17 is formed, the insulating film lying on the main surface of the substrate 1, which is not covered with the conductive layer 16, also grows. However, the conductive layer 16 has its upper and side faces formed with a thicker silicon oxide film than the remaining portion by the influences of the phosphor introduced. The silicon oxide film, i.e., the insulating film 17 can be formed only over the conductive layer 16 by etching all over the surface of the substrate 1 by making use of the difference in the thickness between the insulating film lying over the main surface of the substrate 1 and the silicon oxide film lying over the conductive layer 16.

After the step shown in FIGS. 15 and 16, the insulating film 18 is formed. This film 18 is made of the silicon oxide film, which is prepared by thermally oxidizing the main surface of the substrate 1, to have a thickness of about 300 [A].

After the insulating film 18 is formed, the conductive layer 20 is formed. This conductive layer 20 is made of a polycrystalline silicon layer (of 3,000 [A]) prepared by the CVD. The conductive layer 20 may be composed of the polycrystalline silicon layer and over lying molybdenum silicide layer prepared by the sputter. This polycrystalline silicon layer is formed to have a thickness of about 2,000 [A], and the overlying molybdenum silicide layer is formed to have a thickness of 2,000 to 3,000 [A]. Next, the semiconductor region 19 is formed. This semiconductor region 19 is formed by introducing an n-type impurity (e.g., phosphor or arsenic) into the substrate 1 by the ion implantation using the conductive layer 20, for example, as the mask for the impurity introduction. Next, the insulating film 27 made of a silicon oxide film by the CVD is so formed to cover the conductive layer 20 that its flat portion over the insulating film 26 has a thickness of about 6,000 to 8,000 [A]. Next, the connecting hole 32 shown in FIG. 8 and the connecting hole 29 shown in FIG. 11 are formed by selectively removing the insulating film 27. Next, the conductive layer 31 shown in FIG. 8 and the conductive layer 30 shown in FIG. 11 are formed by the same forming step. The conductive layers 25 and 28 of aluminum are formed to have thicknesses of 6,000 to 8,000 [A] by the sputtering, for example.

Figure 17:
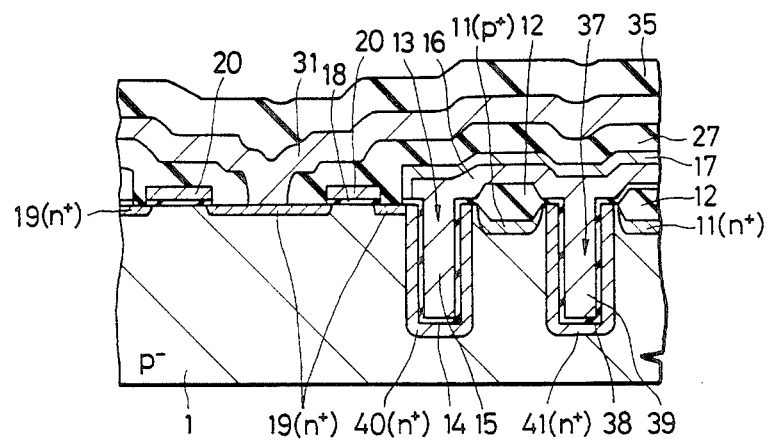
FIGS. 17 to 23 are views for explaining modifications of the second embodiment.

In the second embodiment, as shown in FIG. 17, an $n^+$-type semiconductor region may be formed in the inner surfaces of the trenches 13 and 37.

In FIG. 17, reference numeral 40 indicates an $n^+$-type semiconductor region which is formed on the surface of the trench 13 forming the capacitor C so that it is used as one electrode of the capacitor C. This capacitor C is composed of the trench 13, the conductive layer 15 (or 16) and the semiconductor region 40.

Indicated at numeral 41 is an $n^+$-type semiconductor region which is formed on the surface of the trench 37 so that it is used as the carrier trapping region 8. Incidentally, the semiconductor region 41 may be formed on the main surface of the substrate 1 between the adjacent two trenches 37.

The conductive layer 16 may be connected either the power source potential $V_{CC}$ or the earth potential (0 [V]) of the IC. The semiconductor region 28 located at the corner of the memory cell array 2, as shown in FIG. 11, is connected with the power source potential $V_{CC}$. The minority carriers are trapped by the carrier trapping region 8, i.e., the semiconductor region 41 as a result that the semiconductor region 41 is connected with the semiconductor region 28.

The semiconductor regions 40 and 41 are formed by the same step in the following manner. A polycrystalline silicon layer containing an n-type impurity such as phosphor or arsenic in a concentration of $10^{20}$ [atoms/cm$^3$] is buried in the trenches 13 and 37. Then, the semiconductor regions 40 and 41 are formed by thermally diffusing the abovespecified impurity contained in the silicon layer into the substrate 1. After these semiconductor regions 40 and 41 are formed, the polycrystalline silicon layer in the trenches 13 and 37 is wholly removed. Next, the insulating film 14 is formed.

The gap between the adjacent two trenches 37 is so determined that any $p^-$-type semiconductor region is not left inbetween. The semiconductor region 41 may be formed by extending continuous grooves. In this modification, the semiconductor region 41 becomes the region 41 extending along the above-specified grooves.

This semiconductor region 41 can also be formed by the following method. After the trenches 13 and 37 are formed, specifically, the semiconductor region 41 is formed by disposing the substrate 1 in a diffusion furnace, by feeding this diffusion furnace with an impurity gas and then by heating the diffusion furnace.

Figure 18:
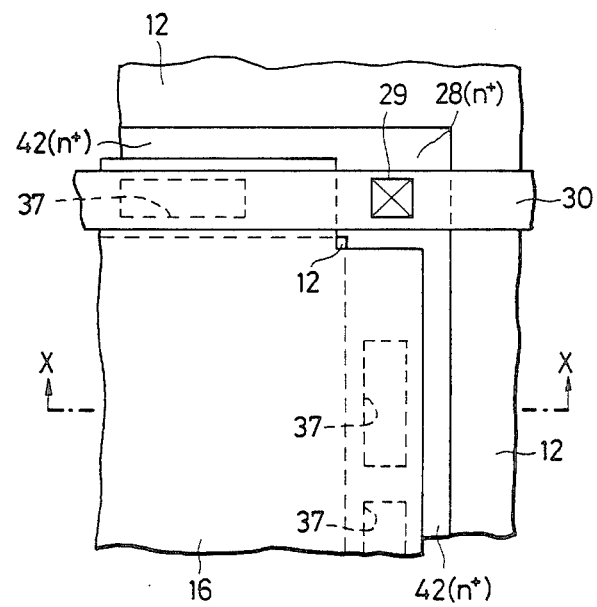
Figure 19:
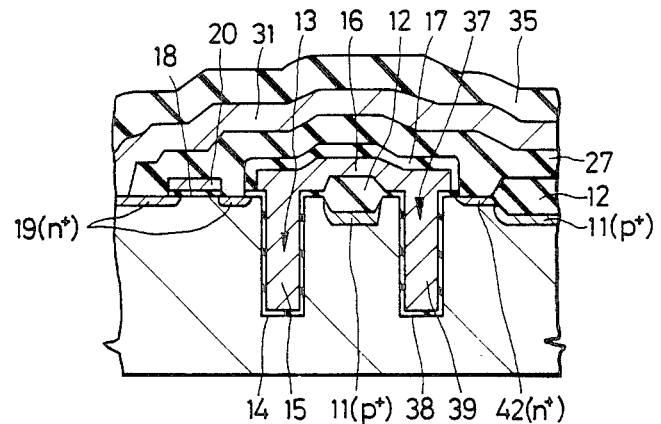

In the second embodiment, as shown in FIGS. 18 and 19, an $n^+$-type semiconductor region may be formed outside of the trenches 37.

FIG. 18 is a top plan view showing the end portion of the memory cell array, and FIG. 19 is a section taken along line X—X of FIG. 18. In FIG. 18, the capacitor, MISFET, conductive layer and so on formed in the memory cell array are omitted but are formed like those in FIG. 8.

Indicated at numeral 42 is then $n^+$-type semiconductor region which is formed on the main surface of the substrate 1 at the side portion of the conductive layer 16 so that it is used as a transmission path for the unnecessary minority carriers, which are trapped by the carrier trapping region 8, to penetrate into the semiconductor region 28. Thanks to the provision of the semiconductor region 42, the minority carriers trapped can be satisfactorily brought to the outside of the substrate 1. This is because the sectional area of the transmission path made of the semiconductor region 42 is larger than that of the transissation path which is made of the depletion or inversion layer formed in the main surface of the carrier trapping region 8 by applying the power source potential $V_{CC}$ to the conductive layer 16. This is also because the transmission path made of the semiconductor region 42 has a small resistance.

The semiconductor region 42 is formed by the impurity introducing step for the semiconductor region 19 after the conductive layer 20 is formed. This makes the step unnecessary especially for forming the semiconductor step 42.

Both the semiconductor regions 41 and 42 may be formed.

Figure 20:
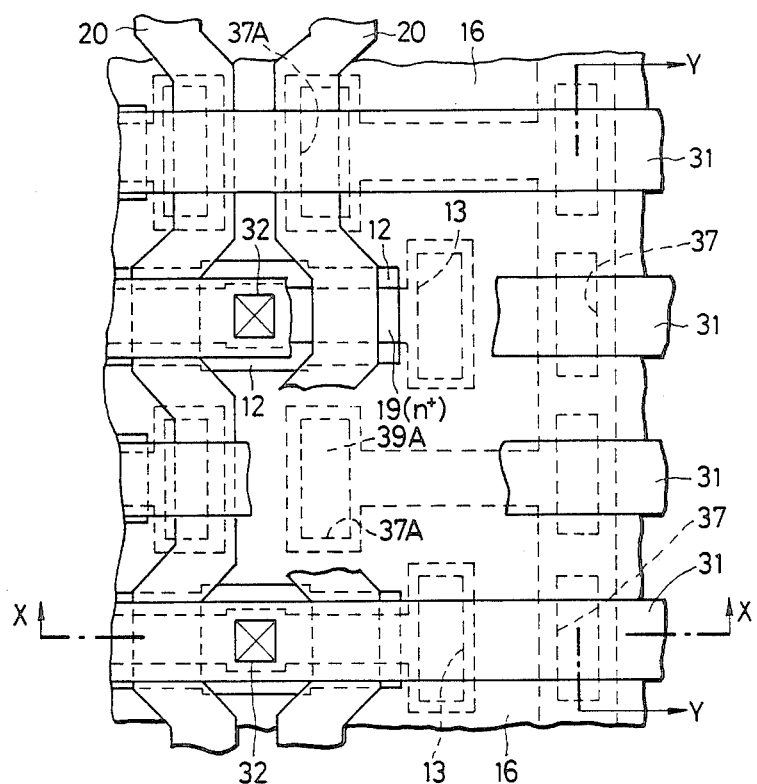

In the second embodiment, moreover, trenches which are not used as the capacitor of the memory cell may be formed at the end of the memory cell array 2, as shown in FIG. 20.

The memory cell array 2 is formed in its outer periphery with the carrier trapping region 8 like the second embodiment. In addition to this, a carrier trapping region 8A is formed at the end of the memory cell array 2. The carrier trapping region 8A comprises a trench 37A, a (not shown) insulating film covering at least the inner wall of the trench 37A, and a conductive layer 39A to be buried in the trench 37A. The conductive layer 39A is connected with the same potential as that of the conductive layer 39 or the conductive layer 16. Since, in this modification, the conductive layers 16 and 39 are at the same potential, the conductive layer 39A is connected with the power source potential $V_{CC}$. As a result, a depletion layer is formed around the trench 37A like the trench 37. The unnecessary minority carriers trapped by the carrier trapping region 8A in the memory cell array 2 are released to the carrier trapping region 8 in the outer periphery of the memory cell array 2.

An inversion or depletion layer for providing a transmission path for releasing the minority carriers is formed in the periphery of the memory cell array 2. This transmission path is formed in the main surface 1 of the substrate 1 by the power source potential $V_{CC}$ applied to the conductive layer 16. Not the field insulating film 12 but an insulating film identical to the insulating film 14 is formed between the trench 37A and the trench 37 facing the former. As a result, the region for providing the transmission line has the MIS structure which is constructed of the substrate 1, the overlying thin insulating film, and the overlying conductive layer 16. The depletion or invertsion layer formed in the main surface of the substrate 1 by the potential $V_{CC}$ provides the transmission path. The minority carriers generated in the memory cell 2 are trapped by the carrier trapping region 8A until they are released to the outside of the memory cell array 2.

The trench 37A, the conductive layer 39A and their intervening insulating film are formed at the steps of forming the trench 13, the conductive layer 15 and the insulating film 14, respectively. Therefore, their especial forming steps can be dispensed with.

The trench 37A performs the following actions in addition to the action to form the carrier trapping region 8A.

The capacitor C in the periphery of the memory cell array 2 and the capacitor C at the central portion of the memory cell array 2 are different in the electric conditions given from their peripheries. Specifically, the capacitor C at the central portion of the memory cell array 2 is subjected to the effect of the electric field which is established by the charge stored in its adjacent capacitor C. The capacitor C in the periphery of the memory cell array 2 is less affected by the electric field due to the aforementioned stored charge because of the absence of the capacitor C outside thereof. In the present embodiment, the above-specified difference in the electric conditions can be eliminated thanks to the facts that the trench 37A is formed in the end of the memory cell array 2, that the trench 37A is made to have the structure similar to that of the capacitor C, and that the gap between the trenches 37A and 13 is made substantially equal to that between the trenches 13. This makes it possible to reduce the dispersion between the charge stored in the capacitor C at the central portion of the memory cell array 2 and the charge stored in the capacitor C in the periphery of the same.

Figure 21:
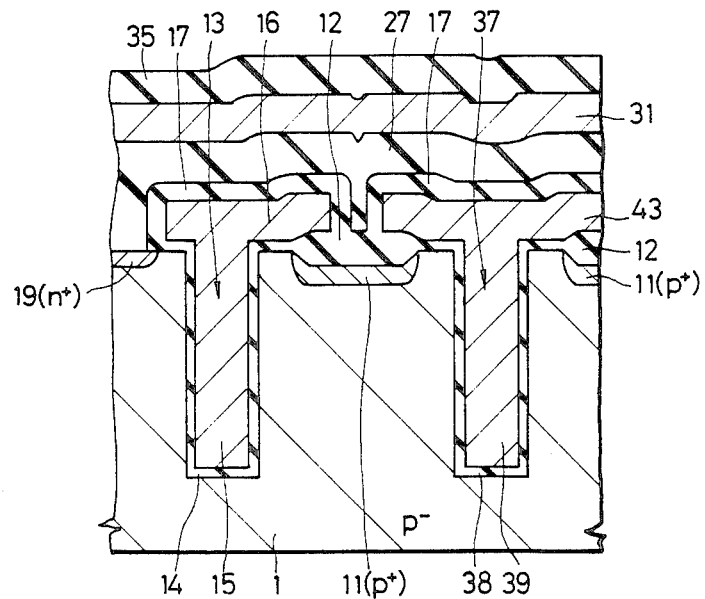
Figure 22:
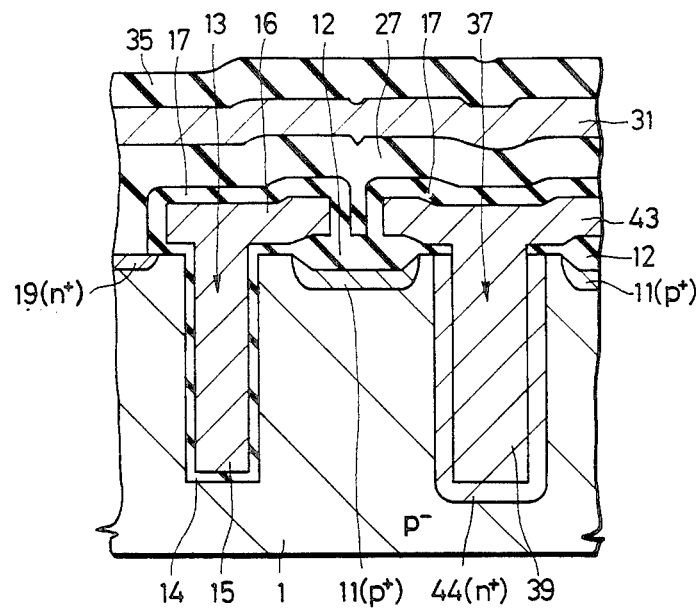
Figure 23:
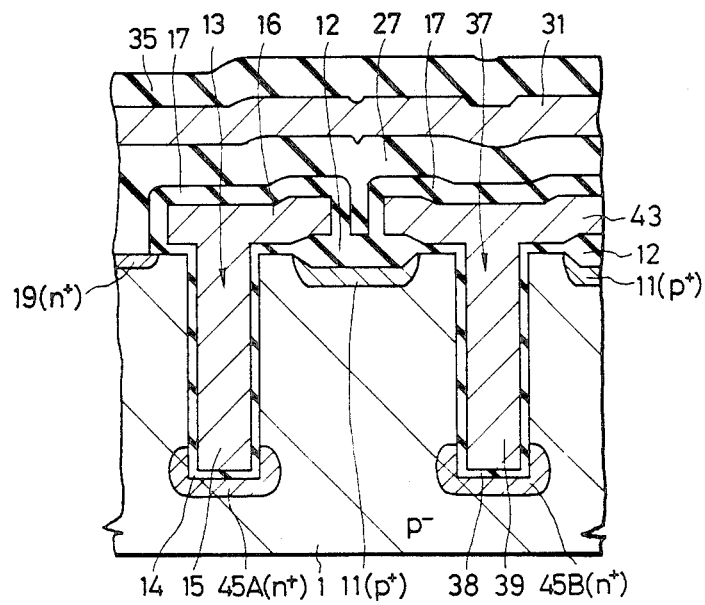

In the second embodiment, as shown in FIG. 21 to 23, the electrode of the capacitor of the memory cell can be formed such that it is isolated from the electrode of the carrier trapping region. FIGS. 21 to 23 are enlarged sectional views showing the portion corresponding to a portion of FIG. 9.

In FIG. 21, the carrier trapping region 8 has its conductive layer 43 isolated from the conductive layer 16 but connected electrically with the conductive layer 39. The conductive layer 43 is connected with the power source potential $V_{CC}$. Incidentally, this conductive layer 43 may be connected with a higher potential such as 7.0 to 8.0 [V] than the power source potential $V_{CC}$ (5.0 [V]) so that it may be formed deeper in the substrate 1 of the carrier trapping region 8. Moreover, one or both of the semiconductor regions 40 and 41 shown in FIG. 17 may be formed.

FIG. 22 is a sectional view showing a modification in which an n+-type semiconductor region is formed in the surface of the trench of the carrier trapping region and in which the electrode connected with that region is buried in the trench. The carrier trapping region 8 is constructed to comprise the trench 37, the conductive layer 39, and the n+-type semiconductor region 44.

This n+-type semiconductor region 44 is formed to extend from the boundary between the conductive layer 39 and the substrate 1 into the substrate 1, and the semiconductor region 44 and the conductive layer 39 constructing the carrier trapping region 8 together are connected in each trench. As a result, the minority carriers trapped can be released in a satisfactory extent to the outside of the substrate 1.

The semiconductor region 44 is formed by the same method as that of forming the semiconductor region 41 after the insulating film 38 is formed. The semiconductor region 44 may be formed by removing the insulating film 38 in the trench 37 after both the semiconductor regions 40 and 41 are formed.

The conductive layer 43 has a potential such as that $V_{CC}$ of the power source.

FIG. 23 is a sectional view showing a modification in which the n+-type semiconductor region is formed in the bottom of the trench.

This n+-type semiconductor region 45A is formed in the substrate 1 at the bottom of the trench 13. The capacitor C comprises the trench 13, the insulating film 14, the conductive layer 15 and the semiconductor region 45A. Another n+-type semiconductor region 45B is formed in the substrate 1 at the bottom fo the trench 37. The carrier trapping region 8 is constructed of the semiconductor region 45B and the depletion layer formed around the overlying insulating film 38.

The semiconductor regions 45A and 45B are formed by the following steps. First of all, the trenches 13 and 37 are formed. Next, and n-type impurity such as phosphor is introduced into the substrate at the bottoms of the trenches 13 and 37 by the ion implantation. The mask for introducing the n-type impurity is the etching one which was used at the step of forming the trenches 13 and 37. By the thermally oxidizing step of forming the insulating films 14 and 38, the above-specified impurity is diffused into the substrate 1 to form the semiconductor regions 45A and 45B. One of these semiconductor regions 45A and 45B may be selectively formed. In case only the semiconductor region 45B is formed, for example, the depletion layer constructing the carrier trapping region 8 can be formed deeper than the charge storing depletion layer so that the trapping ratio of the minority carriers can be improved. As a result, the minority carriers generated in the deeper region an be trapped by the semiconductor region 45B.

In FIGS. 21 and 23, incidentally, the conductive layers 16 and 43 can be formed integrally with each other.

The carrier trapping regions in the first and second embodiments and in their aforementioned various modifications should not have their layouts limited to that of FIG. 2 but may have their layouts modified to those shown in FIGS. 24 to 28.

Figure 24:
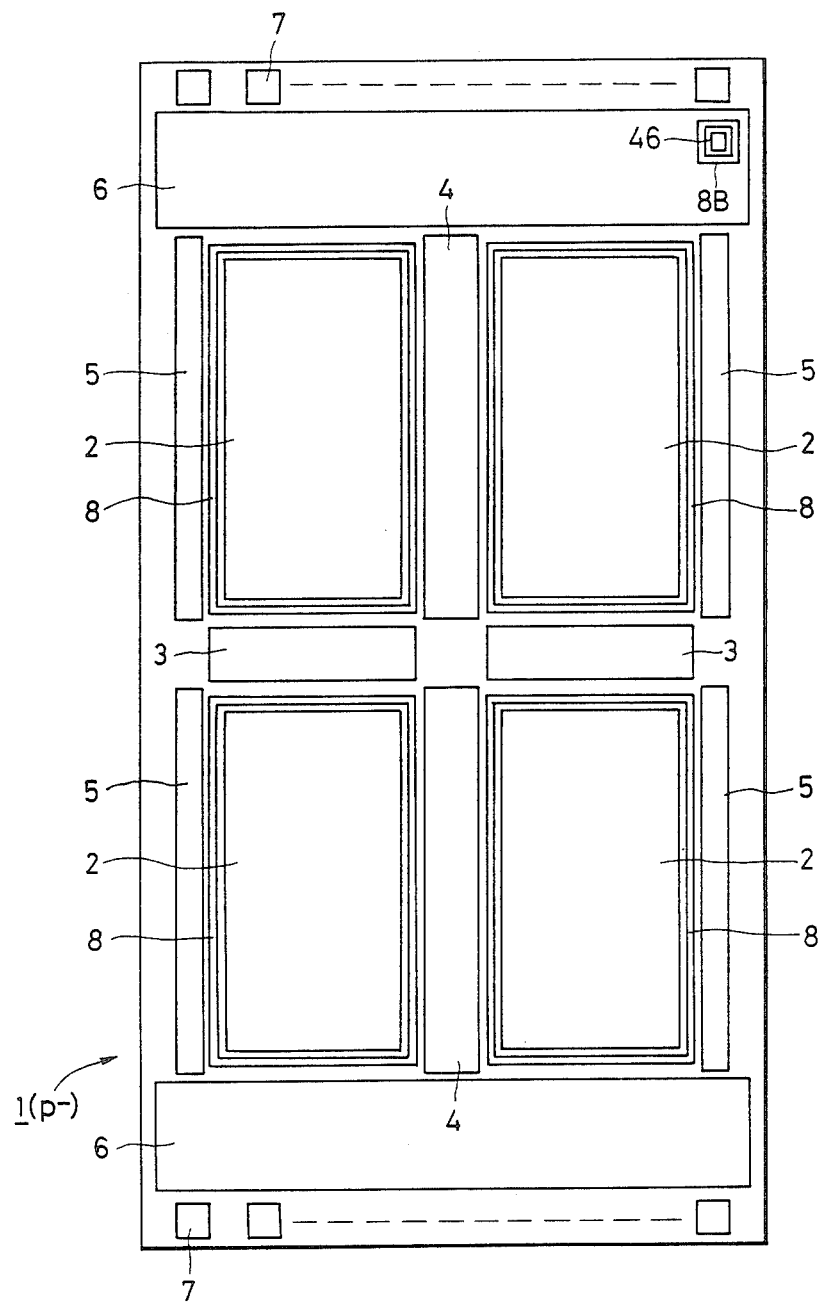
FIGS. 24 to 28 are views for explaining the layouts of a carrier trapping region.

Indicated at numeral 46 in FIG. 24 is a substrate bias voltage generating circuit which is disposed in a predetermined portion of the peripheral circuit region 6 for biasing the substrate 1 to a negative potential such as −2.5 to −3.0 [V]. This substrate bias voltage generating circuit 46 is constructed of an oscillator, a rectifier and so on such that the rectifier has its negative potential connected electrically with the substrate 1. Indicated at numeral 8B is a carrier trapping region which is formed in the vicinity of the substrate bias voltage generating circuit 46 for trapping the minority carriers injected from the substrate bias voltage generating circuit 46 into the substrate 1. Thanks to the provision of this carrier trapping region 8B, the minority carriers injected from the recifier of the substrate bias voltage generating circuit 46 into the substrate 1 can be sufficiently trapped by the outer periphery of the substrate bias voltage generating circuit 46.

In the present embodiment, the carrier trapping region 8B is formed in the outer periphery of the substrate bias voltage generating circuit 46, which generates more minority carriers than the peripheral circuit such as a sense amplifier, an input/output buffer or a word line selector, and the carrier trapping region 8 is formed in the outer periphery of the memory cell array 2. The unnecessary minority carrier to penetrate into the memory cell array 2 can be reduced only by the carrier trapping region 8B.

Figure 25:
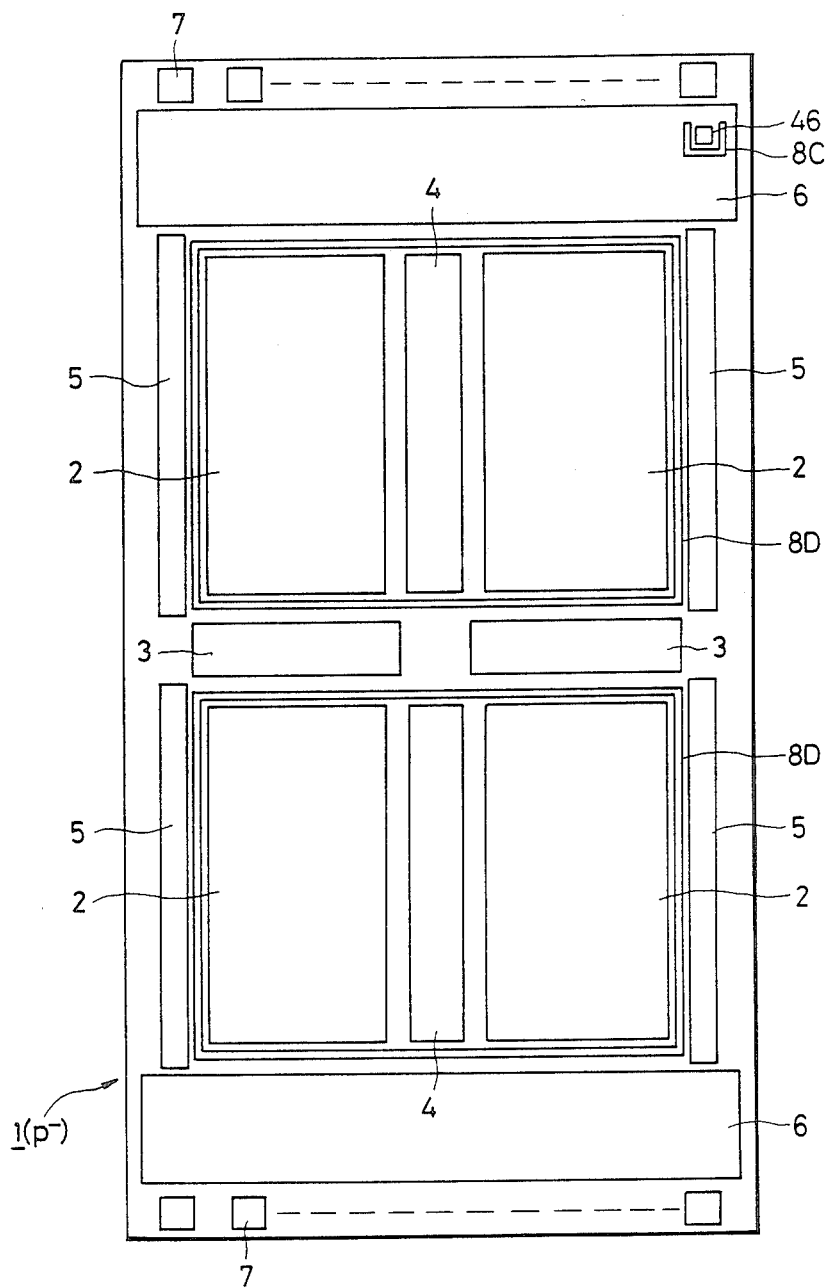

In FIG. 25, a carrier trapping region 8C is formed by removing the portion of the carrier trapping region 8B at the side of the bonding pads 7. The minority carriers, which are injected from the substrate bias voltage generating circuited 46 into the substrate 1 to diffuse to the bonding pads 7, will not exert influences upon the capacitor C. Therefore, the carrier trapping region 8C is not formed in the substrate bias voltage generating circuit 46 at the side of the bonding pads 7.

A carrier trapping region 8D is formed to enclose the outer peripheries of the memory cell array 2 and the bit line selecting circuit region 4. With this carrier trapping region 8D, the minority carriers which otherwise penetrate into the memory cell array 2 can be reduced.

Figure 26:
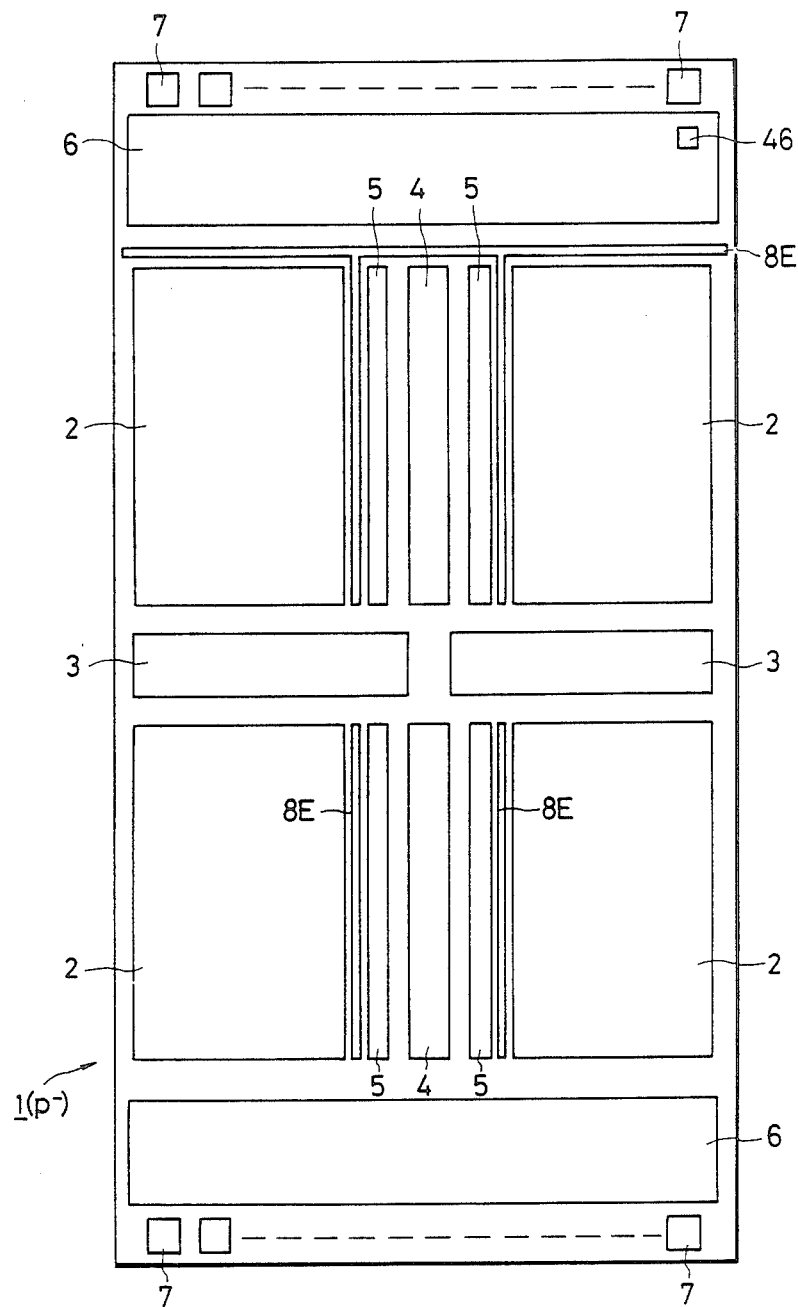

In FIG. 26, the sense amplifier region 5 is formed between the memory cell array 2 and the bit line selecting circuit region 4.

Indicated at numeral 8E in FIG. 26 is a carrier trapping region which is formed to shield the closer one of the memory cell arrays 2 to the peripheral circuit region 6 formed with the substrate bias voltage generating circuit 46 from the sense amplifier region 5 and the peripheral circuit region 6. With this carrier trapping region 8E, especially the minority carriers, which might otherwise be generated from the substrate bias voltage generating circuit 46 to penetrate into the memory cell array 2 are reduced.

The carrier trapping region 8E formed between the memory cell array 2 and the sense amplifier region 5 also reduces the penetration of the unnecessary minority carriers, which are generated by operating the sense amplifier, into the memory cell array 2. In the DRAM of the type in which the data written in the memory cell are to be read out by using a dummy cell, the minority carriers are injected into the substrate 1 from the capacitor constructing the dummy cell. In order to trap the minority carriers by the carrier trapping region 8E, therefore, the dummy cell is formed between the carrier trapping region 8E and the sense amplifier region 5.

Figure 27:
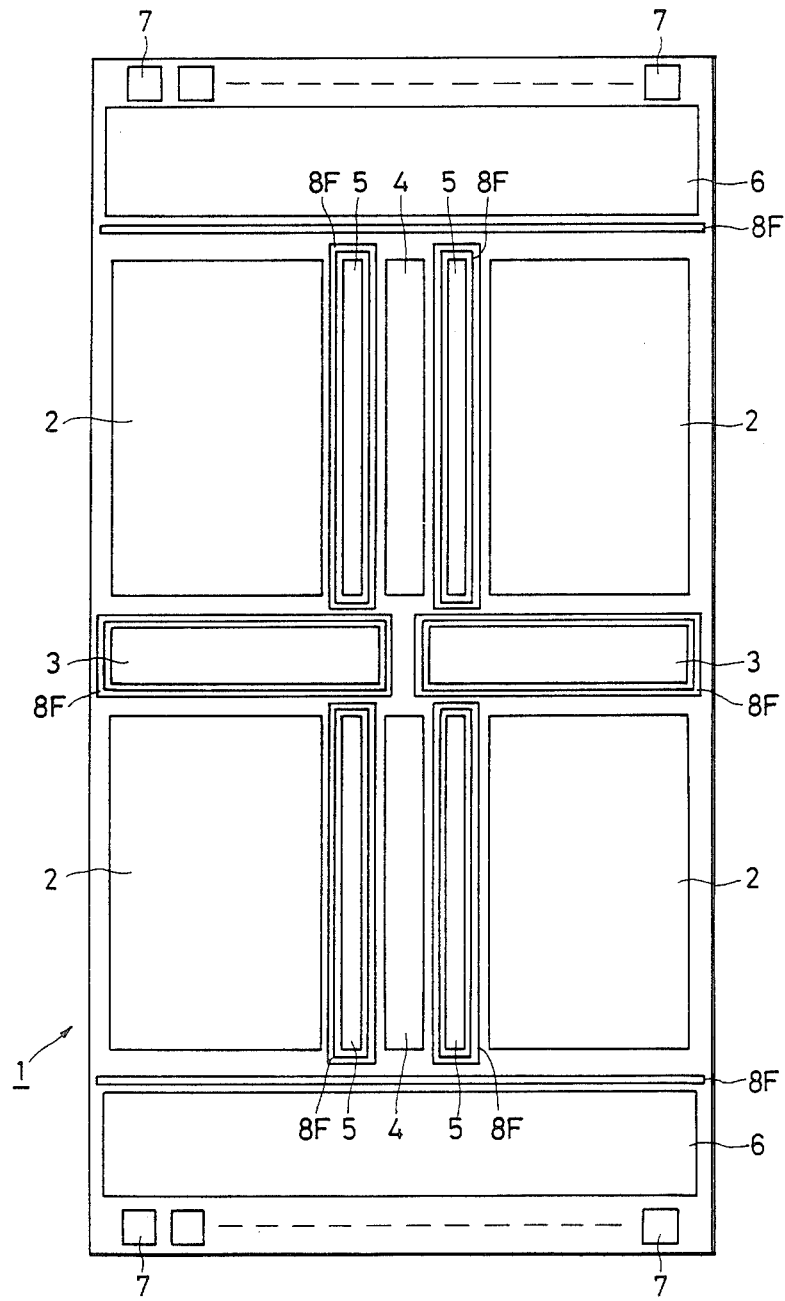

In FIG. 27, a carrier trapping region 8F is formed in the outer peripheral portion of each of the sense amplifier region 5 and the word line selecting circuit region 3 and between the peripheral circuit region 6 and the memory cell array 2. The carrier trapping region 8F traps especially the minority carriers which are generated from the peripheral circuit region 6, the sense amplifier region 5 and the word line selecting circuit region 3. The minority carriers generated from the bit line selecting circuit region 4 are trapped by the carrier trapping region 8F in the outer periphery of the sense amplifier region 5.

Thanks to the provision of the carrier trapping region 8F, the unnecessary minority carriers to penetrate into the memory cell array 2 can be reduced.

Figure 28:
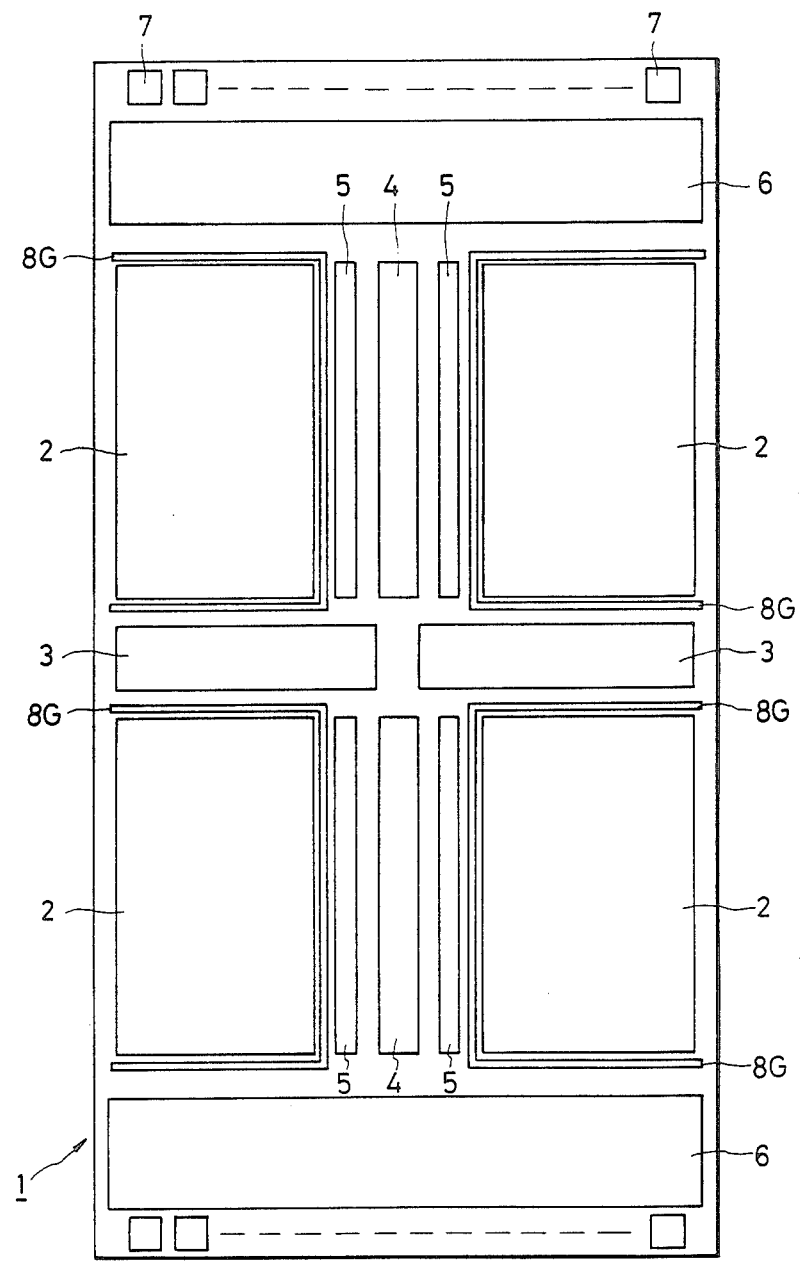

In FIG. 28, a carrier trapping region 8G is formed generally in the shape of letter "C" in the outer periphery of the memory cell array 2. This carrier trapping region 8G need not be limited to the "C" shape but may take any shape if it shields the memory cell array 2 from the peripheral circuit region 6, the sense amplifier region 5, the word line selecting circuit region 3 and the bit line selecting circuit region 4.

As has been described hereinbefore, according to the novel technical means disclosed in the present patent application, the following effects can be attained.

(1) The carrier trapping region can be formed deeper than the surce or drain region. As a result, the minority carriers to be generated in the substrate, especially, in the deep region of the same can be sufficiently trapped. This makes it possible to effectively prevent the reduction in the stored capacitance of the capacitor having its one electrode in the substrate. The number of the fabrication steps is not increased because the carrier trapping region is formed simultaneously with the trenches forming a part of the capacitor of the well region or the memory cell, for example.

(2) The carrier trapping region is constructed to comprise the semiconductor region, which is formed in the outer periphery of the memory cell array to have a depth of about 3 to 4 microns, and/or the depletion layer which is formed in the boundary between the semiconductor region and the substrate. As a result, the carrier trapping region can trap the minority carriers which are generated within a range from the main surface of the substrate to the depth of the bottom of the trenches forming a part of the capacitor, especially, the trench type capacitor. This makes it possible to reduce the unnecessary minority carriers which might otherwise penetrate into the capacitor.

(3) In the outer periphery of the memory cell array, there are formed a plurality of trenches which extend inward from the main surface of the substrate and which have a depth substantially equal to that of the trenches forming the capacitor. An insulating film is formed to cover the inner walls of the plural trenches. Moreover, a conductive layer is formed to fill up the trenches. The portions thus formed construct together the carrier trapping region. The depletion layer extending into the substrate also forms a part of the carrier trapping region. By this carrier trapping region, it is enabled to sufficiently trap the minority carriers which are present within a range from the main surface of the substrate to the depth of the bottoms of the trenches forming the capacitor.

(4) Thanks to the above-itemized effects (1) to (3), it becomes possible to reduce the minority carriers which might otherwise penetrate from the inside of the substrate around the memory cell array into the memory cell array. In other words, the change of the charge, which provides the data stored in the capacitor constructing the memory cell, can be made gradual with the minority carriers. This makes it possible to elongate the holding time of the data written in the memory cell of the DRAM, i.e., the refresh cycle. Since the frequency for rewriting the data once written in the DRAM can be reduced, the time period required for the rewrite can be shortened so that the DRAM can have its effective operating speed improved.

(5) Since the carrier trapping region is formed around the substrate bias voltage generating circuit, it can sufficiently trap the undesired minority carriers, which are injected from the substrate bias voltage generating circuit into the substrate by the carrier trapping region, so that the unnecessary minority carriers to penetrate into the memory cell array can be reduced.

This can elongate the refresh cycle so that the effective operating speed of the DRAM can be increased.

Although the present invention has been specifically described hereinbefore in connection with the embodiments thereof, it is quite natural that the present invention should not be limited to the specified embodiments but can be modified in various manners without departing from the gist thereof.

For example, the capacitor of the memory cell need not be of the trench type. The present invention can be applied to the case in which the capacitor is partially formed of the substrate.

The present invention is also effective in the open bit line type DRAM.

In the second embodiment, the peripheral circuit may include a p-channel MISFET like the first embodiment, and the conductivity type of each semiconductor region can be reversed.

In the first embodiment, the carrier trapping region may be constructed by combining the aforementioned modifications. This likewise applies to the second embodiment.

Moreover, the carrier trapping region may be constructed by combining the first and second embodiments. For example, a second carrier trapping region which is formed by using the well region may be formed adjacent to a first carrier trapping region which is formed by using the trenches. In case the capacitor of the memory cell is of the trench type, it is preferred that the first carrier trapping region be formed at an inner side. In this modification, still moreover, the first carrier trapping region may preferably be formed with the trenches 37A in the memory cell array, as shown in FIG. 20.

The carrier trapping region may be constructed by combining the modifications exemplified in the first and second embodiments.

Incidentally, in these embodiments, the word and bit line selecting circuits 3 and 4 and sense amplifier 5 are distinguished from the peripheral circuit 6 for convenience. But it is needless to say that the periphral circuit 6 includes the word and bit line selecting circuit 3 and 4 and sense amplifier 5. Namely, the carrier trapping regions of the present embodiments are formed between memory cell arrayes 2 and periphral 3, 4, 5 and 6.

The present invention is effective for the semiconductor integrated circuit device which has a capacitor formed partialy of a semiconductor substrate.

What is claimed is:

1. A semiconductor integrated circuit device comprising:
a semiconductor substrate of a first conductivity type having a first main surface;
a memory cell array formed on said semiconductor substrate and including a plurality of memory cells arrayed in rows and columns, wherein each said memory cell comprises a MISFET and a capacitor connected in series with each other, wherein said capacitor is formed by using a first trench formed in the first main surface of said semiconductor substrate, said capacitor having a first insulating film formed on the surface of said first trench and a first electrode formed over said first insulating film;
a peripheral circuit formed in said semiconductor substrate in portions other than said memory cell array; and
a carrier trapping region formed in said semiconductor substrate between said memory cell array and said peripheral circuit, wherein said carrier trapping region comprises second trenches formed in the main surface of said semiconductor substrate, insulating films which are formed on the surface of said second trenches, and second electrodes made of a conductive material formed over the surface of said insulating films in said second trenches.

2. A semiconductor integrated circuit device according to claim 1, wherein a plurality of said second trenches are forming at a predetermined spacing from one another which spacing is set such that depletion layers formed in said semiconductor substrate around said trenches can be coupled to each other under a fixed potential applied to said electrode.

3. A semiconductor integrated circuit device according to claim 2, wherein said conductive material is a polycrystalline silicon.

4. A semiconductor integrated circuit device according to claim 3, wherein said second electrodes are formed integrally with each other.

5. A semiconductor integrated circuit device according to claim 4, wherein said first and second electrodes are formed integrally with each other.

6. A semiconductor integrated circuit device according to claim 1, wherein said second trenches are made to extend continuously with each other.

7. A semiconductor integrated circuit device according to claim 6, wherein said conductive material is a polycrystalline silicon.

8. A semiconductor integrated circuit device according to claim 1, wherein said peripheral circuit is comprised of a plurality of MISFETs.

9. A semiconductor integrated circuit device according to claim 8, wherein said peripheral circuit is a sense amplifier.

10. A semiconductor integrated circuit device according to claim 9, wherein said carrier trapping region is disposed between said memory cell array and said sense amplifier.

11. A semiconductor integrated circuit device according to claim 10, wherein said carrier trapping region surrounds said memory cell array.

12. A semiconductor integrated circuit device according to claim 1, wherein said carrier trapping region has a semiconductor region of second conductivity type which is formed in the surface of said second trenches.

13. A semiconductor integrated circuit device comprising:
a semiconductor substrate of a first conductivity type having a first main surface;
a memory cell array formed on said semiconductor substrate and including a plurality of memory cells arrayed in rows and columns and a plurality of data and word lines, wherein each said memory cell comprises a MISFET and a capacitor connected in series with each other and each said memory cell is selected by choosing predetermined data and word lines, wherein said capacitor is formed by using a first trench formed in the first main surface of said semiconductor substrate, said capacitor having a first insulating film formed on the surface of said first trench and a first electrode formed over said first insulating film;

a peripheral circuit formed in said semiconductor substrate in portions other than said memory cell array and said peripheral circuit is comprised of a plurality of MISFETs; and a carrier trapping region formed in said semiconductor substrate between a memory cell located at the end of each row or column in said memory cell array and said peripheral circuit, wherein said carrier trapping region comprises second trenches formed in the main surface of said semiconductor substrate, insulating films which are formed on the surface of said second trenches, and second electrodes made of a conductive material formed over the surface of said insulating films in said second trenches.

14. A semiconductor integrated circuit device according to claim 13, wherein a plurality of said second trenches are formed at a predetermined spacing from one another which spacing is set such that depletion layers formed in said semiconductor substrate around said second trenches can be coupled to each other under a fixed potential applied to said electrode.

15. A semiconductor integrated circuit device according to claim 14, wherein said conductive material is a polycrystalline silicon.

16. A semiconductor integrated circuit device according to claim 15, wherein said second electrodes are formed integrally with each other.

17. A semiconductor integrated circuit device according to claim 16, wherein said first and second electrodes are formed integrally with each other.

18. A semiconductor integrated circuit device according to claim 14, wherein said second trenches are made to extend continuously with each other.

19. A semiconductor integrated circuit device according to claim 18, wherein said conductive material is a polycrystalline silicon.

20. A semiconductor integrated circuit device according to claim 13, wherein said peripheral circuit is comprised of a plurality of MISFETs.

21. A semiconductor integrated circuit device according to claim 20, wherein said peripheral circuit is a sense amplifier.

22. A semiconductor integrated circuit device according to claim 21, wherein said carrier trapping region is disposed between said memory cell array and said sense amplifier.

23. A semiconductor integrated circuit device according to claim 22, wherein said carrier trapping region surrounds said memory cell array.

24. A semiconductor integrated circuit device according to claim 13, wherien said carrier trapping region has a semiconductor region of second conductivity type which is formed in the surface of said second trenches.

* * * * *